(12) United States Patent
Hata et al.

(10) Patent No.: US 7,916,766 B2
(45) Date of Patent: Mar. 29, 2011

(54) SEMICONDUCTOR LASER DEVICE AND MANUFACTURING METHOD THEREOF

(75) Inventors: Masayuki Hata, Kodama (JP); Yasuhiko Nomura, Osaka (JP); Kyoji Inoshita, Tottori (JP)

(73) Assignee: Sanyo Electric Co., Ltd., Moriguchi (JP)

(*) Notice: Subject to any disclaimer, the term of this patent is extended or adjusted under 35 U.S.C. 154(b) by 64 days.

(21) Appl. No.: 12/511,218

(22) Filed: Jul. 29, 2009

(65) Prior Publication Data

US 2010/0034234 A1 Feb. 11, 2010

(30) Foreign Application Priority Data

Aug. 5, 2008 (JP) ................. 2008-201851

(51) Int. Cl.
*H01S 5/00* (2006.01)
*H01S 3/097* (2006.01)

(52) U.S. Cl. ...................... 372/50.12; 372/87

(58) Field of Classification Search ............... 372/50.12, 372/50.121, 87
See application file for complete search history.

(56) References Cited

FOREIGN PATENT DOCUMENTS

JP 2006-269987 A 10/2006
JP 2008-124218 A 5/2008

*Primary Examiner* — Armando Rodriguez
(74) *Attorney, Agent, or Firm* — Marvin A. Motsenbocker; Mots Law, PLLC

(57) ABSTRACT

A first semiconductor laser element is formed on a surface of the first substrate and including a first active layer. A second semiconductor laser element is bonded to the first semiconductor laser element with a first insulating film interposed therebetween. A first electrode is connected to the first semiconductor laser element. A second electrode is arranged on the surface of the first semiconductor laser element with the first insulating film interposed therebetween and connected to the second semiconductor laser element. The first semiconductor laser element has an optical waveguide formed in a region where the second semiconductor laser element is not bonded while the first electrode is arranged on the region, and the second electrode is formed to extend from between the second semiconductor laser element and first insulating film toward the region.

20 Claims, 16 Drawing Sheets

SEMICONDUCTOR LASER DEVICE AND MANUFACTURING METHOD THEREOF

CROSS REFERENCE TO RELATED APPLICATIONS

This application claims priority based on 35 USC 119 from prior Japanese Patent Application No. P2008-201851 filed on Aug. 5, 2008, entitled "Semiconductor Laser Device and Manufacturing Method Thereof", the entire contents of which are incorporated herein by reference.

BACKGROUND OF THE INVENTION

1. Field of the Invention

The invention relates to a semiconductor laser device and a manufacturing method thereof, and in particular, relates to a semiconductor laser device including multiple integrated semiconductor laser elements and a manufacturing method thereof.

2. Description of Related Art

Compact disk (CD)/compact disk-recordable (CD-R) drives include semiconductor laser elements emitting infrared light with a wavelength of about 780 nm (infrared semiconductor laser elements) as light sources. Digital versatile disk (DVD) drives include semiconductor laser elements emitting light with a wavelength of about 650 nm as light sources.

On the other hand, DVDs which are recordable and capable of playback using blue-violet light with a wavelength of about 405 nm have been developed in recent years. For recording and playback of such DVDs, next-generation DVD drives including semiconductor laser elements emitting light with a wavelength of 405 nm have also been developed simultaneously. Those DVD drives need to be compatible with conventional CDs, CD-Rs and DVDs.

The compatibility with conventional CDS, DVDS, and DVDs recordable and capable of playback in this case is achieved, for example, by a method of providing a DVD drive with plural optical disk pick-up devices emitting infrared, red, and blue-violet light beams, respectively, or by a method of providing an optical disk pick-up device with infrared, red, and blue-violet semiconductor laser devices individually. However, these methods lead to an increase in the number of parts, thus making it difficult to miniaturize optical disk pick-up devices, simplify the structure thereof, and lower the prices.

To prevent such an increase in the number of parts, an infrared semiconductor laser element (wavelength: about 780 nm) and a red semiconductor laser element are formed together on a GaAs substrate to be integrated into a single chip as a semiconductor laser element, which is already put into practical use. Moreover, by integrating semiconductor laser elements into a single chip, light emitting positions of the semiconductor laser elements for respective wavelengths are formed accurately.

In contrast, blue-violet semiconductor laser elements are not formed on GaAs substrates. It is therefore very difficult to integrate a blue-violet semiconductor laser element with the infrared and red semiconductor laser elements into a single chip. Moreover, in order to reduce losses and aberrations of laser light beams emitted from the semiconductor laser elements for respective wavelengths, the light emitting positions thereof need to be located as close as possible to each other.

To this end, there have been proposed integrated semiconductor laser devices which have a structure obtained by forming individual semiconductor laser elements on different substrates and then bonding the substrates to each other so that light emitting layer sides of the semiconductor laser elements (semiconductor element layers) can face each other.

Japanese Patent Application Publication No. 2006-269987 publication (Patent Literature 1) discloses an integrated semiconductor laser device of a single chip obtained by bonding a blue-violet semiconductor laser element to a monolithic semiconductor laser element including red and infrared semiconductor laser elements so that the light emitting layers thereof (on the p-side semiconductor layer side) face each other. In the semiconductor laser device described in Patent Literature 1, p-side pad electrodes of the blue-violet, red and infrared semiconductor laser elements are separately formed on a joint surface between the blue-violet and monolithic semiconductor laser elements. In a plan view thereof, each of the p-side pad electrodes extends in the resonator direction of the laser element and a part of each electrode has a protrusion extending in a direction substantially perpendicular to the resonator direction. The protrusions of the three p-side pad electrodes extend in the same direction at predetermined intervals and are wire-bonded at an end of the semiconductor laser device in the element width direction.

Japanese Patent Application Publication No. 2008-124218 (Patent Literature 2) discloses an integrated semiconductor light emitting element including: a first light emitting element in which an AlGaInP semiconductor laser element and a GaAs semiconductor laser element are formed and integrated in a single chip on a substrate; and a second light emitting element made of a nitride semiconductor laser element. The first and second light emitting elements are arranged on a support base and are bonded to each other so that the light emitting layers thereof (on the p-side semiconductor layer side) can face each other. In the semiconductor laser device described in Patent Literature 2, p-side pad electrodes of the respective semiconductor laser elements are separately formed on a joint surface between the first and second light emitting elements. In a plan view thereof, each of the p-side pad electrodes extends in the resonator direction of the laser element and a part of each electrode has a protrusion (a wire bonding portion) extending in a direction substantially perpendicular to the resonator direction. The protrusions of the three p-side pad electrodes are configured to pass through predetermined regions and finally be wire-bonded at an end of the semiconductor laser device in the element width direction.

However, in the semiconductor laser device disclosed in Patent Literature 1, it is necessary to provide extra areas for wire bonding (the end portions of the protrusions) of the three p-side pad electrodes at the end of the semiconductor laser device in the element width direction. For this reason, the width of the semiconductor laser device is increased by the exclusive wire bonding areas. Therefore, there is a problem that it is difficult to reduce the width of the semiconductor laser device.

Also in the semiconductor light emitting element disclosed in Patent Literature 2, it is necessary to provide the areas for wire bonding (the end portions of the protrusions) of the three p-side pad electrodes at the end of the integrated semiconductor light emitting element in the width direction. For this reason, the width of the semiconductor laser device is increased by the amount of the exclusive wire bonding areas. Therefore, there is a problem that it is difficult to reduce the width of the semiconductor light emitting element.

SUMMARY OF THE INVENTION

An aspect of the invention provides a semiconductor laser device that comprises: a first substrate; a first semiconductor laser element which is formed on a surface of the first substrate and includes a first active layer; a first insulating film formed on a surface of the first semiconductor laser element on a side including the first active layer; a second semiconductor laser element bonded to the first semiconductor laser element with the first insulating film interposed therebetween; a first electrode connected to the first semiconductor laser element; and a second electrode which is arranged on the surface of the first semiconductor laser element with the first insulating film interposed therebetween and is connected to the second semiconductor laser element, wherein the first semiconductor laser element has an optical waveguide formed in a region where the second semiconductor laser element is not bonded while the first electrode is arranged on the region, and the second electrode is formed to extend from between the second semiconductor laser element and first insulating film toward the region.

In the aforementioned semiconductor laser device, as described above, the second electrode is formed so as to extend from between the second semiconductor laser element and first insulating film toward the region where the first electrode of the first semiconductor laser element is arranged. Accordingly, a part of the second electrode can be arranged in the vicinity of the region where the first electrode is arranged. This eliminates the need to separately provide an extra area for wire bonding to connect the first and second electrodes to respective metallic wires at both ends of the semiconductor laser device. Since there is no need to provide an extra area at one end of the semiconductor laser device for wire bonding, it is possible to easily reduce the width of the element constituting the semiconductor laser device by the extra area for wire bonding.

Moreover, a part of the third electrode can be arranged in the vicinity of the region where the first electrode is arranged. This eliminates the need to separately provide an extra area for wire bonding to connect the metallic wires not only to the first and second electrodes but also the third electrode at both ends of the semiconductor laser device. Since there is no need to provide an extra area at one end of the semiconductor laser device for wire bonding, it is possible to easily reduce the width of the element constituting the semiconductor laser element by the extra area for wire bonding.

Furthermore, the wire bonding regions of the first to third electrodes can be provided using the region of the first semiconductor laser element. Accordingly, the width of the elements constituting the semiconductor laser device can be further reduced.

Still furthermore, the second and third electrodes are formed from both sides of the first electrode toward the region where the first electrode is arranged. Accordingly, the both portions of the second and third electrodes extending toward the region can be shortened.

Still furthermore, the electrode of the second semiconductor laser element opposite to the second electrode and the electrode of the third semiconductor laser element opposite to the third electrode can be commonly provided on the rear surface of the same semiconductor. Moreover, because of the manufacturing process, after being formed on the same growth substrate, the second and third semiconductor laser elements can be simultaneously bonded to the first semiconductor laser element. Thus, the manufacturing process can be simplified.

Another aspect of the invention provides a method of manufacturing a semiconductor laser device, that comprises: forming a first semiconductor laser element on a surface of a first substrate, the first semiconductor laser element including a first active layer and an optical waveguide; forming an insulating film on a surface of the first semiconductor laser element on a side including the first active layer; forming a first electrode above a region where the optical waveguide is formed, the first electrode being connected to the first semiconductor laser element; forming a second semiconductor laser element; forming a second electrode at a position on the surface of the first semiconductor laser element with the insulating film interposed therebetween, the position extending from between the second semiconductor laser element and the insulating film toward the region, the second electrode connected to the second semiconductor laser element; and bonding the second electrode to the second semiconductor laser element.

In the aforementioned method of manufacturing a semiconductor laser device, as described above, the step of forming the second electrode includes the step of forming the second electrode from between the second semiconductor laser element and insulating film toward the region where the first electrode of the first semiconductor laser element is arranged. Accordingly, a part of the second electrode can be arranged in the vicinity of the region where the first electrode is arranged. This eliminates the need to separately provide an extra area for wire bonding to connect the first and second electrodes to respective metallic wires at both ends of the semiconductor device. Since there is no need to provide an extra area at one end of the semiconductor laser device for wire bonding, it is possible to obtain a semiconductor laser device with the element width easily reduced.

DETAILED DESCRIPTION OF EMBODIMENTS

Figure 1:
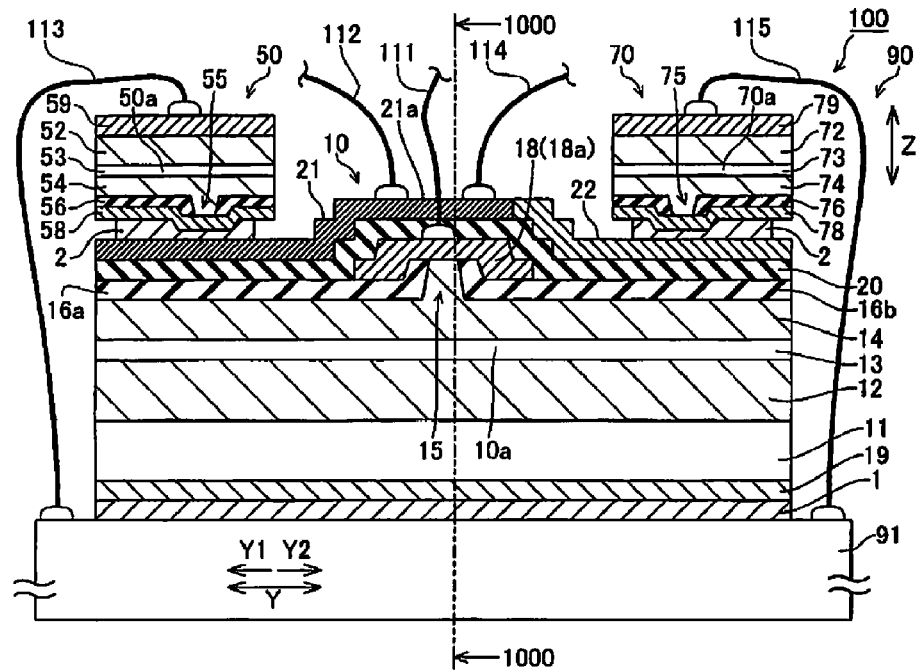
FIG. 1 is a front view showing a structure of a semiconductor laser device according to a first embodiment.

Descriptions are provided hereinbelow for embodiments based on the drawings. In the respective drawings referenced herein, the same constituents are designated by the same reference numerals and duplicate explanation concerning the same constituents is basically omitted. All of the drawings are provided to illustrate the respective examples only. No dimensional proportions in the drawings shall impose a restriction on the embodiments. For this reason, specific dimensions and the like should be interpreted with the following descriptions taken into consideration. In addition, the drawings include parts whose dimensional relationship and ratios are different from one drawing to another.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

First Embodiment

Figure 2:
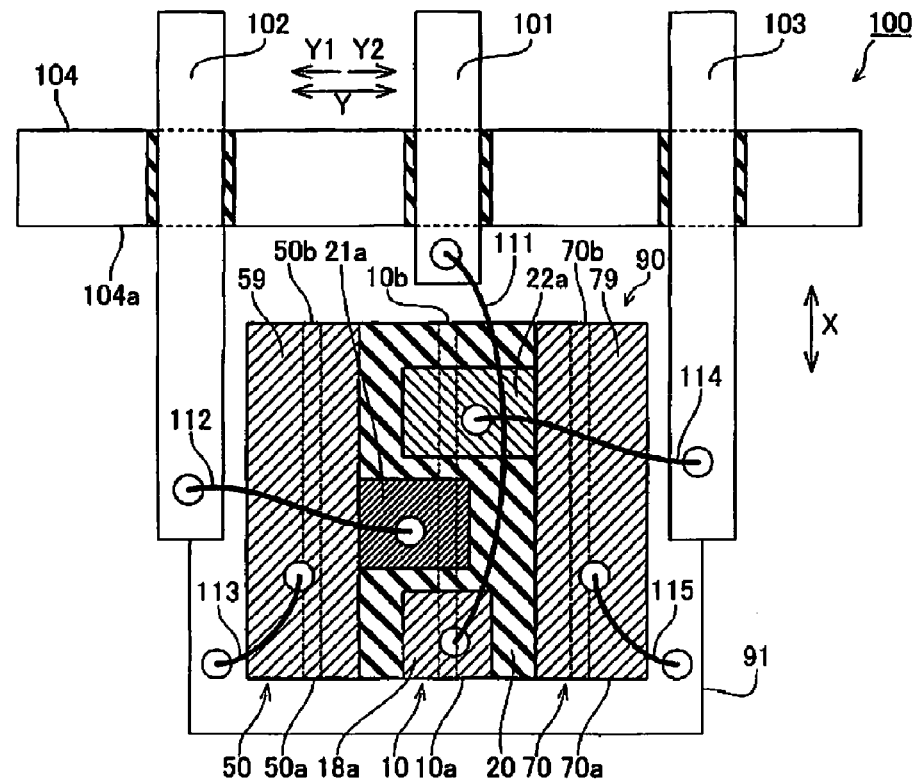
FIG. 2 is a plan view showing the structure of the semiconductor laser device according to the first embodiment shown in FIG. 1.
Figure 3:
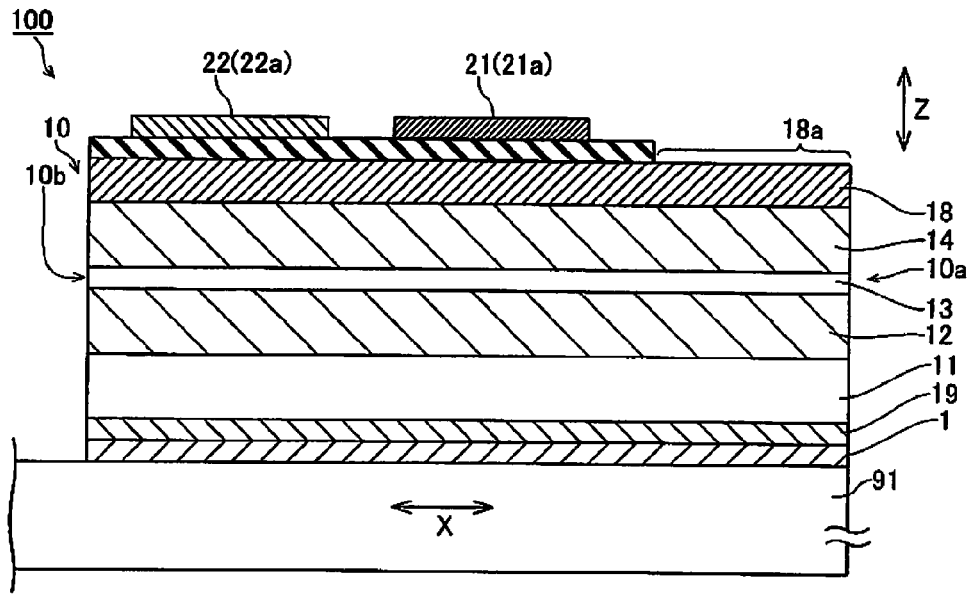
FIG. 3 is a cross-sectional view showing a detailed structure of the semiconductor laser device according to the first embodiment show in FIG. 1.

FIG. 1 is a front view showing a structure of a semiconductor laser device according to a first embodiment. FIG. 2 is a plan view showing the structure of the semiconductor laser device according to the first embodiment shown in FIG. 1. FIGS. 3 to 6 are cross-sectional views showing a detailed structure of the semiconductor laser device according to the first embodiment shown in FIG. 1. With reference to FIGS. 1 to 6, first, a description is given of the structure of semiconductor laser device 100 according to the first embodiment. FIG. 3 shows a cross-sectional view along a line 1000-1000 of FIG. 1 in a resonator direction (X direction) of the semiconductor laser device 100.

As shown in FIG. 1, in semiconductor laser device 100 according to the first embodiment, three-wavelength semiconductor laser element unit 90 is fixed to base 91 with conductive bonding layer 1 interposed therebetween. Three-wavelength semiconductor laser unit 90 includes: blue-violet semiconductor laser element 10 having a width of about 250 μm and an oscillating wavelength of about 405 nm; red semiconductor laser element 50 having a width of about 70 μm and an oscillating wavelength of about 650 nm; and infrared semiconductor laser element 70 having a width of about 70 μm and an oscillating wavelength of about 780 nm. Conductive bonding layer 1 is made of a metallic layer of AuSn solder. Blue-violet, red, and infrared semiconductor laser elements 10, 50, and 70 are examples of first, second, and third semiconductor laser elements, respectively.

As shown in FIG. 2, stem 104 is provided with: base 91 on which three-wavelength semiconductor laser element unit 90 is mounted; three lead terminals 101 to 103 which are insulated from base 91 and are penetrated through bottom 104a; and another lead terminal (not shown) electrically connected with base 91 and bottom 104a.

As shown in FIG. 1, blue-violet semiconductor laser element 10 has a structure in which n-side semiconductor layer 12, active layer 13, and p-side semiconductor layer 14 are stacked on an upper surface of n-type GaN substrate 11. Red semiconductor laser element 50 has a structure in which n-side semiconductor layer 52, active layer 53, and p-side semiconductor layer 54 are stacked. Infrared semiconductor laser element 70 has a structure in which n-side semiconductor layer 72, active layer 73, and p-side semiconductor layer 74 are stacked. Active layers 13, 53, and 73 are examples of first, second, and third active layers of the invention, respectively.

Figure 4:
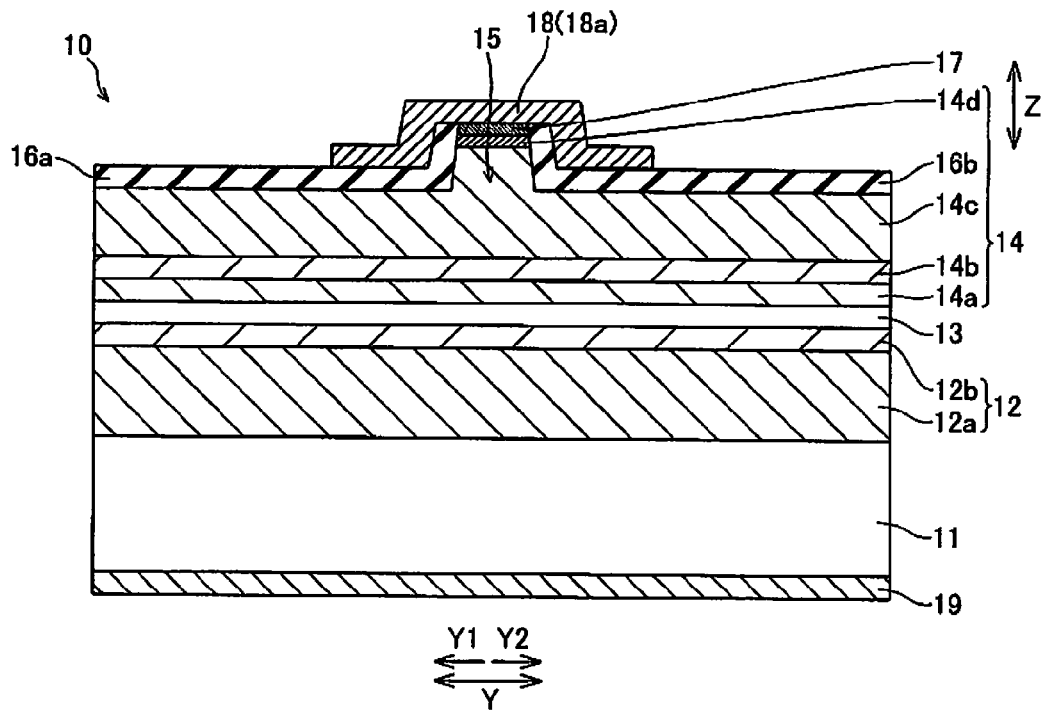
FIG. 4 is a cross-sectional view showing a detailed structure of the semiconductor laser device according to the first embodiment show in FIG. 1.

FIG. 4 shows details of the blue-violet semiconductor laser element 10. N-side semiconductor layer 12 of blue-violet semiconductor laser element 10 includes: n-type cladding layer 12a made of Si-doped n-type $Al_{0.15}Ga_{0.85}N$; and optical guiding layer 12b made of Si doped n-type GaN. P-side semiconductor layer 14 includes: optical guiding layer 14a made of undoped GaN; cap layer 14b made of undoped $Al_{0.3}Ga_{0.7}N$; p-type cladding layer 14c made of Mg-doped p-type $Al_{0.15}Ga_{0.85}N$; and p-side contact layer 14d made of undoped $Ga_{0.95}In_{0.05}N$. Active layer 13 has a multiple quantum well (MQW) structure in which four barrier layers (not shown) made of undoped $Ga_{0.95}In_{0.05}N$ and three well layers (not shown) made of undoped $Ga_{0.09}In_{0.1}N$ are alternately stacked on each other. Active layer 13 may have a single layer or single quantum well (SQW) structure.

As shown in FIG. 4, p-type cladding layer 14c has a protruding section formed substantially at the element center and flat sections extending on both sides of the protruding section (in Y direction). With the protruding section of p-type cladding layer 14, ridge 15 for forming an optical waveguide is formed. Moreover, ridge 15 has a width of about 1.5 μm in Y direction and extends in the resonator direction (X direction).

Current-blocking layers 16a and 16b made of $SiO_2$ are formed so as to cover upper surfaces of the flat sections of p-type cladding layer 14c and side surfaces of ridge 15 (both side surfaces of the protruding section of p-type cladding layer 14c and p-side contact layer 14d). As shown in FIG. 4, p-side ohmic electrode 17 is formed on p-side contact layer 14d and includes Pd, Pt, and Au layers stacked starting from p-side contact layer 14d side. Moreover, p-side pad electrode 18 made of Au or the like is formed so as to cover upper surfaces of p-side ohmic electrode 17 and current-blocking layers 16a and 16b. Current-blocking layers 16a and 16b are examples of first and second insulating films of the invention, respectively, and p-side pad electrode 18 is an example of a first electrode of the invention. N-side electrode 19 is formed on a lower surface of n-type GaN substrate 11 and includes Ti, Pt, and Au layers starting from the n-type GaN substrate 11 side.

Figure 5:
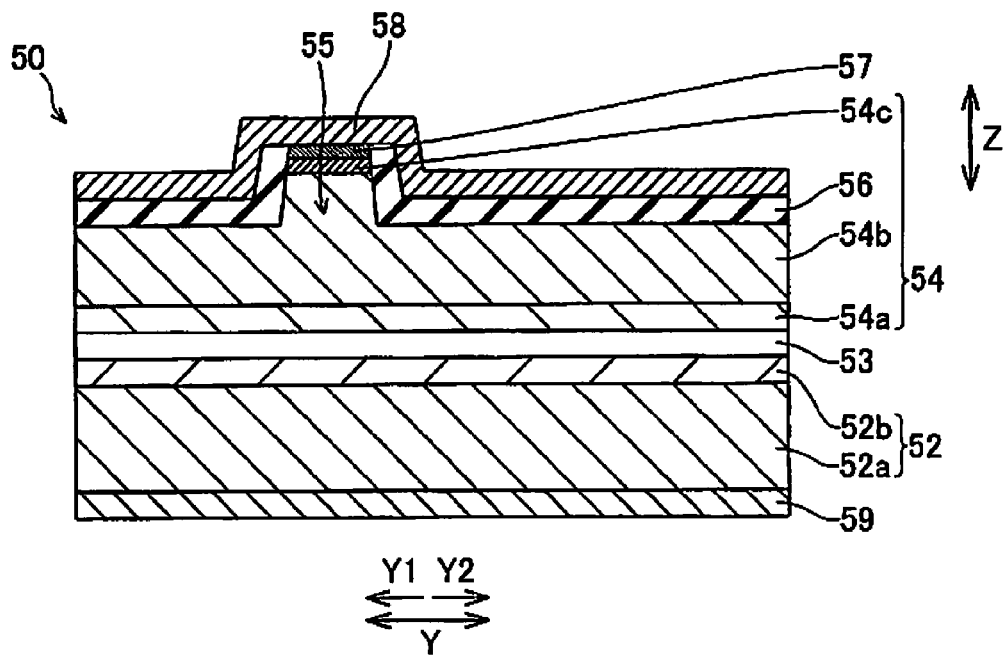
FIG. 5 is a cross-sectional view showing a detailed structure of the semiconductor laser device according to the first embodiment show in FIG. 1.

FIG. 5 shows details of red semiconductor laser element 50. N-side semiconductor layer 52 of red semiconductor laser element 50 includes: n-type cladding layer 52a made of Si-doped n-type $(Al_{0.7}Ga_{0.3})_{0.5}In_{0.5}P$; and optical guiding layer 52b made of undoped $(Al_{0.5}Ga_{0.5})_{0.5}In_{0.5}P$. P-side semiconductor layer 54 includes: optical guiding layer 54a made of undoped $(Al_{0.5}Ga_{0.5})_{0.5}In_{0.5}P$; p-type cladding layer 54b made of Zn-doped $(Al_{0.7}Ga_{0.3})_{0.5}In_{0.5}P$; and p-side contact layer 54c having a stacking structure of Zn-doped p-type $Ga_{0.5}In_{0.5}P$ and Zn-doped p-type GaAs layers. Active layer 53 has an MQW structure in which two barrier layers (not shown) made of undoped $(Al_{0.5}Ga_{0.5})_{0.5}In_{0.5}P$ and three well layers (not shown) made of undoped $In_{0.5}Ga_{0.5}P$ are alternately stacked on each other. The active layer 53 may have a single layer or SQW structure.

As shown in FIG. 5, p-type cladding layer 54b includes: a protruding section which is formed slightly off the substantially element center (in Y1 direction); and flat sections extending on both sides of the protruding section. With this protruding section of p-type cladding layer 54b, ridge 55 for forming an optical waveguide is formed. In addition, ridge 55 has a width of about 2.5 μm in Y direction and extends in the resonator direction (X direction).

Current-blocking layer 56 made of $SiO_2$ is formed so as to cover the upper surfaces of the flat sections of p-type cladding layer 54b and side surfaces of ridge 55 (both side surfaces of the protruding section of p-type cladding layer 54b and p-side contact layer 54c). As shown in FIG. 5, p-side ohmic electrode 57 is formed on p-side contact layer 54c and includes Cr and Au layers stacked starting from the p-side contact layer 54c side. Moreover, p-side pad electrode 58 made of Au or the like is formed so as to cover upper surfaces of p-side ohmic electrode 57 and current-blocking layer 56. In addition, n-side electrode 59 is formed on a lower surface of n-type cladding layer 52a and has AuGe, Ni, and Au layers stacked starting from n-type cladding layer 52a side.

Figure 6:
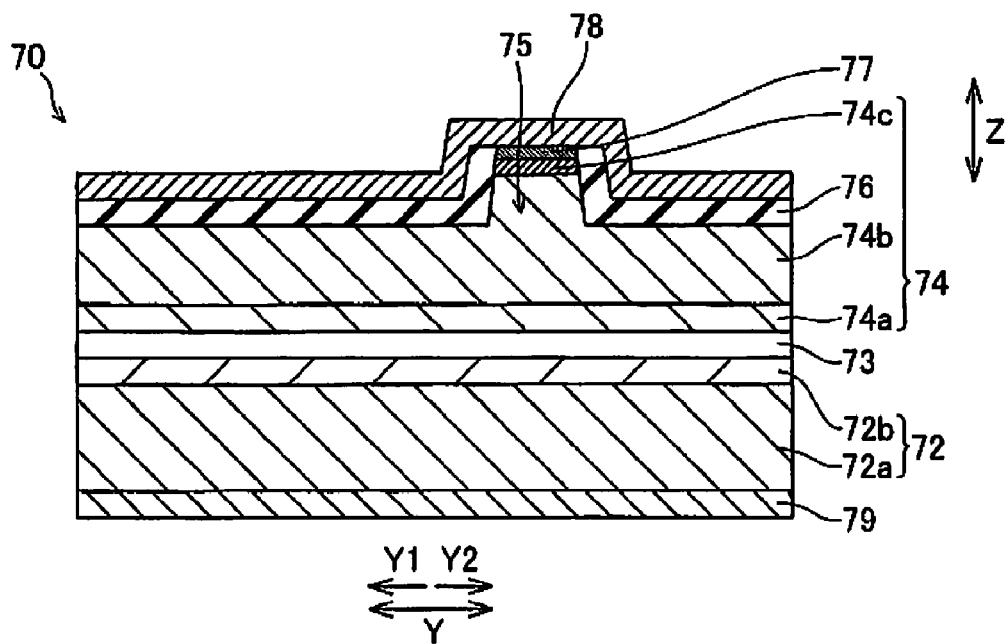
FIG. 6 is a cross-sectional view showing a detailed structure of the semiconductor laser device according to the first embodiment show in FIG. 1.

FIG. 6 shows details of infrared semiconductor laser element 70. N-side semiconductor layer 72 of infrared semiconductor laser element 70 includes: n-type cladding layer 72a made of Si-doped n-type $Al_{0.45}Ga_{0.55}As$; optical guiding layer 72b made of undoped $Al_{0.35}Ga_{0.65}As$. Moreover, p-side semiconductor layer 74 includes: optical guiding layer 74a made of undoped $Al_{0.35}Ga_{0.65}As$; p-type cladding layer 74b made of Zn-doped $Al_{0.45}Ga_{0.55}As$; and p-side contact layer 74c made of Zn-doped p-type GaAs. In addition, active layer 73 has an MQW structure in which two barrier layers (not shown) made of undoped $Al_{0.35}Ga_{0.65}As$ and three well layers (not shown) made of undoped $Al_{0.1}Ga_{0.09}As$ are alternately stacked on each other. Active layer 73 may have a single layer or SQW structure.

As shown in FIG. 6, p-type cladding layer 74b includes: a protruding section which is formed slightly off substantially the element center (in Y2 direction); and flat sections extending on both sides of the protruding section. With this protruding section of p-type cladding layer 74b, ridge 75 for forming an optical waveguide is formed. In addition, the ridge 75 has a width of about 2.8 μm in Y direction and extends in the resonator direction (X direction).

Current-blocking layer 76 made of SiN is formed so as to cover upper surfaces of the flat sections of p-type cladding layer 74b and side surfaces of ridge 75 (both side surfaces of the protruding section of p-type cladding layer 74b and p-side contact layer 74c). As shown in FIG. 6, p-side ohmic electrode 77 is formed on p-side contact layer 74c and includes Cr and Au layers stacked starting from p-side contact layer 74c side. Moreover, p-side pad electrode 78 made of Au or the like is formed so as to cover upper surfaces of p-side ohmic electrode 77 and current-blocking layer 76. In addition, n-side electrode 79 is formed on a lower surface of n-type cladding layer 72a and includes AuGe, Ni, and Au layers stacked starting from n-type cladding layer 72a side.

In the first embodiment, as shown in FIG. 1, insulating film 20 made of $SiO_2$ is formed so as to cover the surface of blue-violet semiconductor laser element 10 opposite to n-type GaN substrate 11. As shown in FIGS. 1 to 3, insulating film 20 made of $SiO_2$ covers the surface of blue-violet semiconductor laser element 10 on the side including the active layer 13 with only wire bonding region 18a, which is a part of p-side pad electrode 18, exposed to the outside. The insulating film 20 is an example of the first or second insulating film of the invention.

Electrode layer 21 covers a part of insulating film 20 in a region of blue-violet semiconductor laser element 10 to which red semiconductor laser element 50 is bonded and has wire bonding region 21a (see FIG. 2) protruding to extend in Y2 direction up to above the region where ridge 15 of blue-violet semiconductor laser element 10 is formed. Electrode layer 22 covers a part of insulating film 20 in a region of blue-violet semiconductor laser element 10 to which infrared semiconductor laser element 70 is bonded and has wire bonding region 22a (see FIG. 2) protruding to extend in Y1 direction to above the region where ridge 15 of blue-violet semiconductor laser element 10 is formed. As shown in FIGS. 2 and 3, wire bonding regions 18a, 21a, and 22a have a plane area of about 80 μm by 80 μm and are arranged in the resonator direction (X direction) at predetermined intervals so as not to be in contact with each other. Accordingly, the wire bonding regions of the semiconductor laser elements are concentrated above the region where ridge 15 of blue-violet semiconductor laser element 10 is formed. The electrode layers 21 and 22 are examples of second and third electrodes of the invention, respectively.

Moreover, in the first embodiment, as shown in FIG. 1, p-side pad electrode 58 of red semiconductor laser element 50 is bonded to a part of electrode layer 21 on blue-violet semiconductor laser element 10 with conductive bonding layer 2 interposed therebetween, conductive bonding layer 2 being made of a metallic layer of AuSn solder or the like. At the same time, p-side pad electrode 78 of infrared semiconductor layer element 70 is bonded to the electrode layer 22 on blue-violet laser element 10 with the conductive bonding layer 2 interposed therebetween.

As shown in FIG. 2, blue-violet semiconductor laser element 10 is connected to lead terminal 101 through metallic wire 111 bonded to wire bonding region 18a of p-side pad electrode 18, while n-side electrode 19 (see FIG. 1) thereof is electrically connected to base 91 through conductive bonding layer 1. Red semiconductor laser element 50 is connected to lead terminal 102 through metallic wire 112, which is bonded to wire bonding region 21a of electrode layer 21, and is connected to base 91 through metallic wire 113 bonded to n-side electrode 59. Furthermore, infrared semiconductor laser element 70 is connected to lead terminal 103 through metallic wire 114 bonded to wire bonding region 22a of electrode layer 22 and is connected to base 91 through metallic wire 115 bonded to n-side electrode 79. Semiconductor laser device 100 therefore has a configuration in which the p-side electrodes of the semiconductor laser elements are individually connected to the lead terminals insulated from each other, while n-side electrodes are connected to the common terminal (a common cathode configuration).

Moreover, at both ends of blue-violet, red, and infrared semiconductor laser elements 10, 50, and 70 constituting three-wavelength semiconductor laser element unit 90 in the resonator direction (X direction), light emitting surfaces 10a, 50a, and 70a and light reflecting surfaces 10b, 50b, and 70b are formed, respectively. In light emitting surfaces 10a, 50a, and 70a of the semiconductor laser elements, low-reflectance dielectric multilayer films (not shown) are formed. In light reflecting surfaces 10b, 50b, and 70b, high-reflectance dielectric multilayer films (not shown) are formed. Herein, each dielectric multilayer film can be a multilayer film made of GaN, AlN, BN, $Al_2O_3$, $SiO_2$, $ZrO_2$, $Ta_2O_5$, $Nb_2O_5$, $La_2O_3$, SiN, $MgF_2$, and materials having compositions different from those materials, such as $Ti_3O_5$ and $Nb_2O_3$.

FIGS. 7 to 10 are views illustrating a manufacturing process of the semiconductor laser device according to the first embodiment shown in FIG. 1. Next, with reference to FIGS. 1, 2, and 7 to 10, a description is given of the manufacturing process of semiconductor laser device 100 according to the first embodiment.

Figure 7:
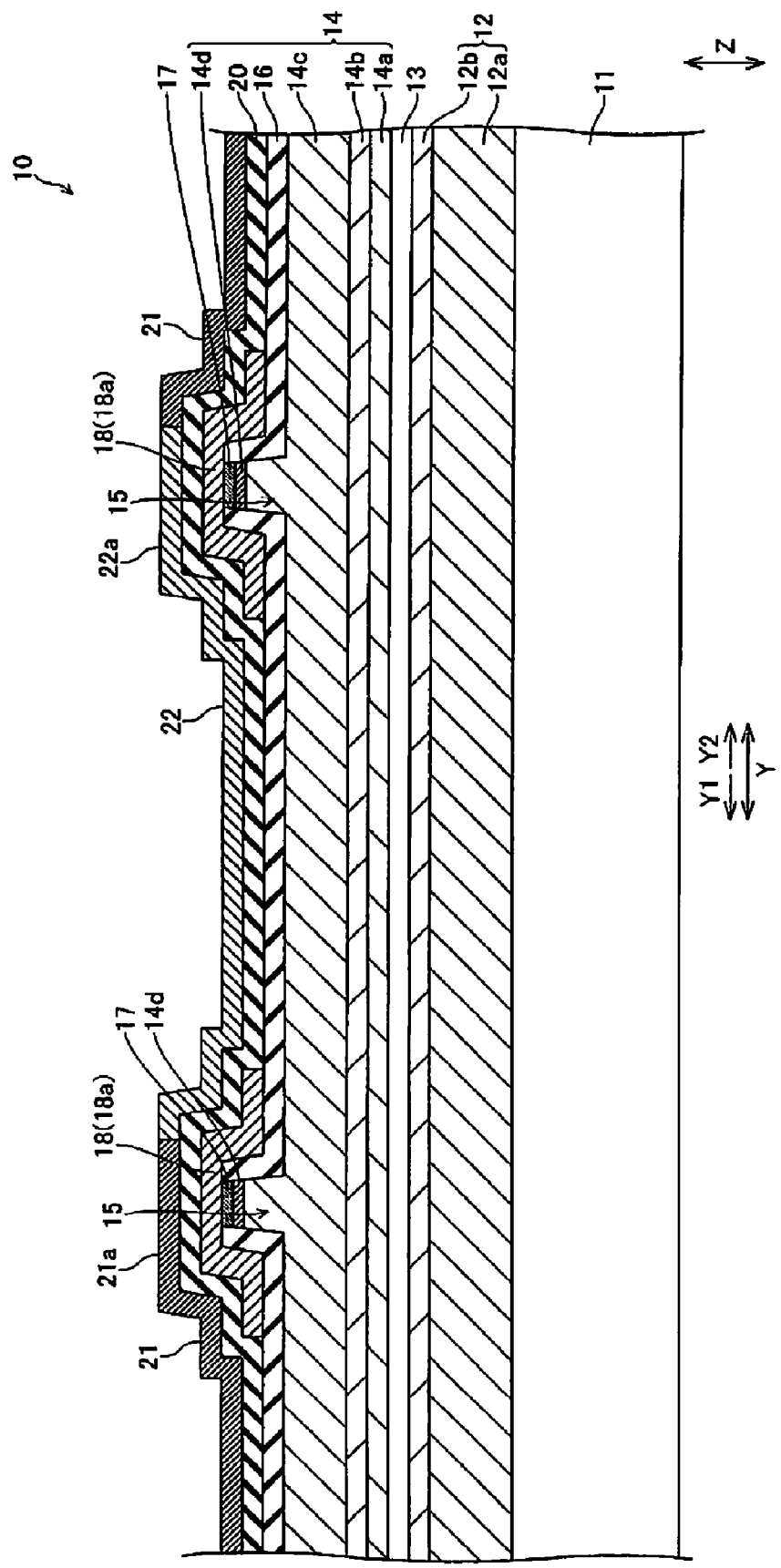
FIG. 7 is a view illustrating a manufacturing process of the semiconductor laser device according to the first embodiment shown in FIG. 1.

In the manufacturing process of semiconductor laser device 100 according to the first embodiment, as shown in FIG. 7, on the upper surface of n-type GaN substrate 11, n-side semiconductor layer 12, active layer 13, and p-side semiconductor layer 14 are sequentially formed, and then ridge 15, current-blocking layer 16, p-side ohmic electrode 17, and p-side pad electrode 18 are formed, thus producing blue-violet semiconductor laser element 10 except for n-side electrode 19. Current-blocking layer 16 is an example of the first or second insulating film of the invention.

As shown in FIG. 7, subsequently, insulating film 20 is formed by vacuum deposition so as to cover the surface of p-side pad electrode 18 and a part of the upper surface of current-blocking layer 16 where p-side pad electrode 18 is not formed. At this time, as shown in FIG. 8, insulating film 20 is formed so that only wire bonding region 18a of p-side pad electrode 18 is exposed to the outside.

Figure 8:
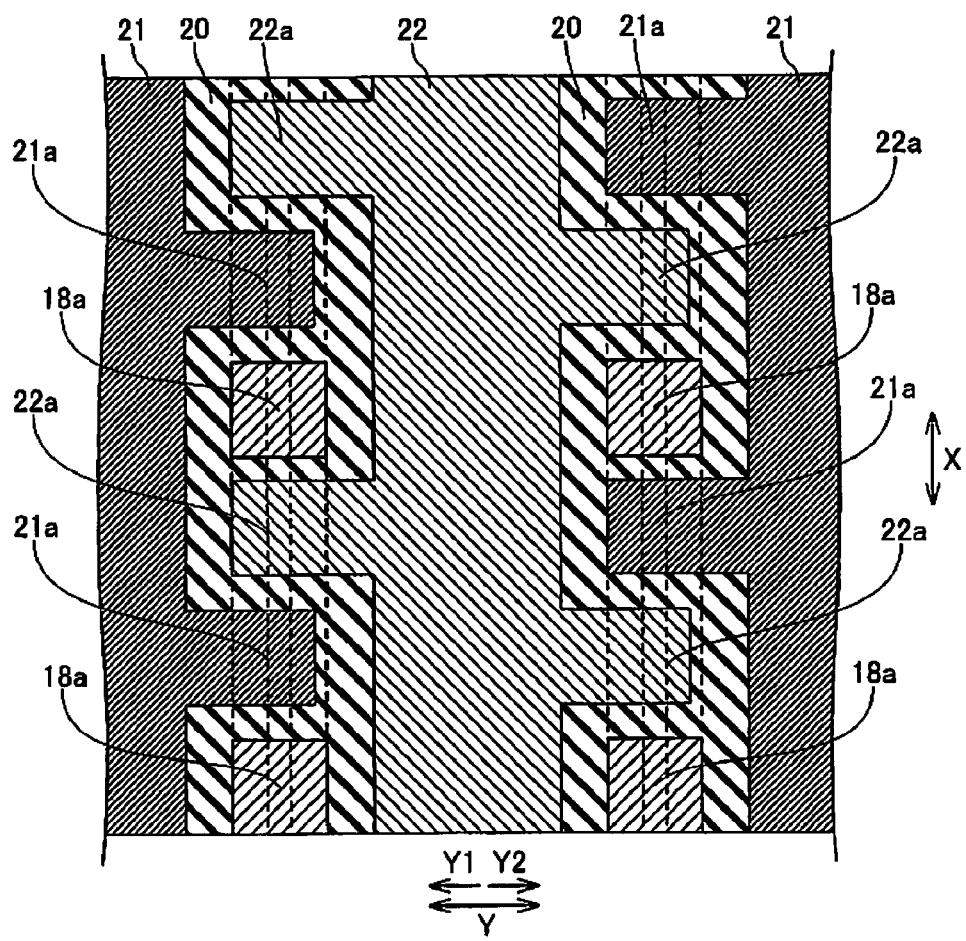
FIG. 8 is a view illustrating the manufacturing process of the semiconductor laser device according to the first embodiment shown in FIG. 1.

Subsequently, as shown in FIGS. 7 and 8, electrode layers 21 and 22 are formed by vacuum deposition so as to cover predetermined regions of the insulating film 20.

Herein, in the manufacturing process of the first embodiment, as shown in FIG. 8, electrode layer 21 is formed so as to cover the part of insulating film 20 in the region of blue-violet semiconductor laser element 10 to which red semiconductor laser element 50 is bonded and a part of electrode layer 21 extends in Y2 direction to form wire bonding region 21a up to above the region where ridge 15 of blue-violet semiconductor laser element 10. Electrode layer 22 is formed so as to cover the part of insulating film 20 in the region of blue violet semiconductor laser element 10 to which infrared semiconductor laser element 70 is bonded and a part of electrode layer 21 extends in Y1 direction to form wire bonding region 22a up to above the region where ridge 15 of blue-violet semiconductor laser element 10. Wire bonding regions 18a, 21a, and 22a are formed in X direction at predetermined intervals so as not to be in contact with each other. Thus, a wafer including blue-violet semiconductor laser element 10 is formed except for n-side electrode 19.

Figure 9:
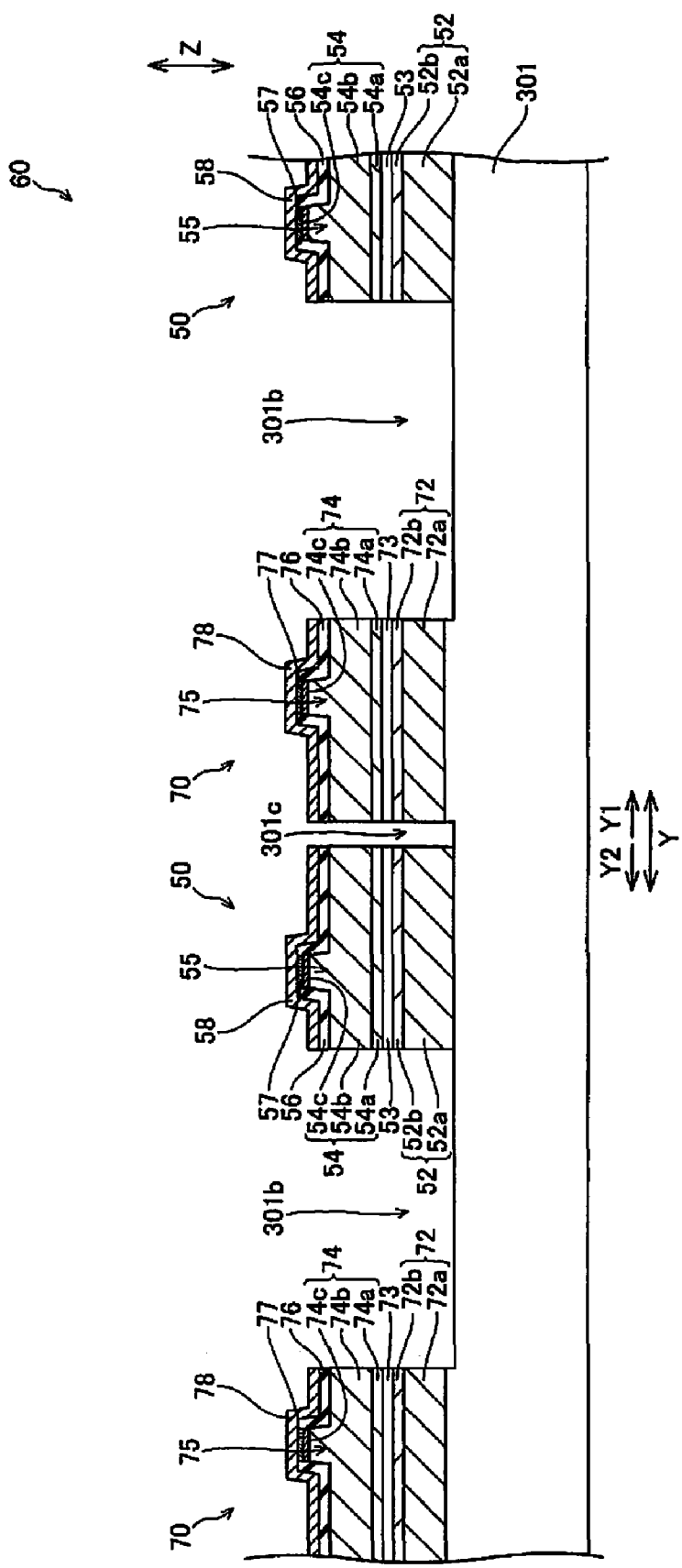
FIG. 9 is a view illustrating the manufacturing process of the semiconductor laser device according to the first embodiment shown in FIG. 1.

As shown in FIG. 9, on the upper surface of n-type GaN substrate 301, n-side semiconductor layer 72, active layer 73, and p-side semiconductor layer 74 serving as infrared semiconductor laser element 70 are sequentially formed. Subsequently, n-side semiconductor layer 72, active layer 73, and p-side semiconductor layer 74 are partly etched to expose a part of n-type GaAs substrate 301. On a part of the exposed portion, n-side semiconductor layer 52, active layer 53, and p-side semiconductor layer 54 constituting each red semiconductor laser element 50 are sequentially formed with regions which serve as recesses 301b and 301c left. Subsequently, ridges 55 and 75, current-blocking layers 56 and 76, p-side ohmic electrodes 57 and 77, and p-side pad electrodes 58 and 78 are formed. In such a manner, red and infrared semiconductor laser elements 50 and 70 spaced at predetermined intervals in Y direction by recesses 301b and 301c, whose bottoms reach n-type GaAs substrate 301, are formed. Thus, a wafer including red and infrared two-wavelength semiconductor laser element 60 is formed except for n-side electrodes 59 and 79.

Figure 10:
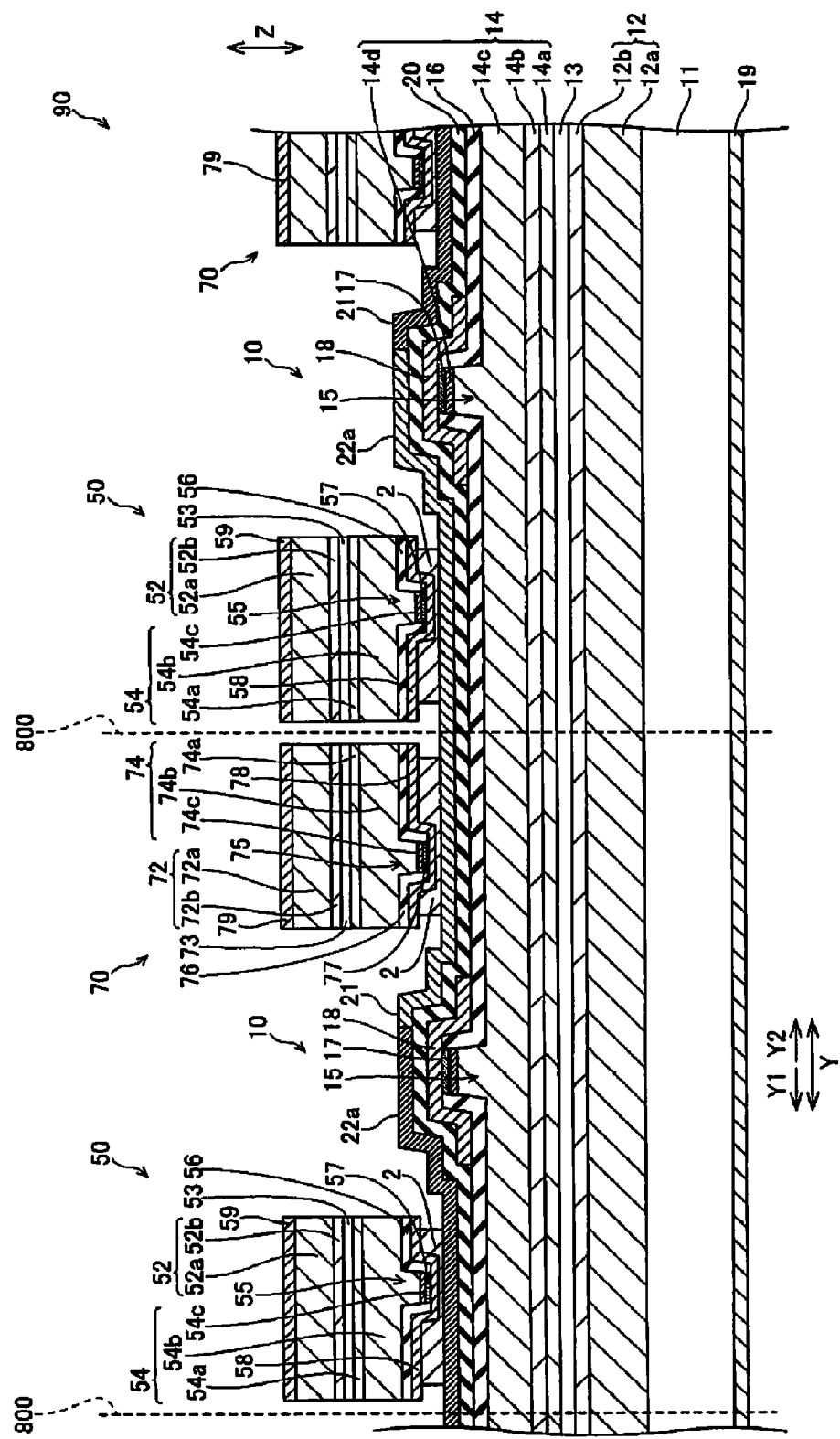
FIG. 10 is a view illustrating the manufacturing process of the semiconductor laser device according to the first embodiment shown in FIG. 1.

The wafer including blue-violet semiconductor laser elements 10 and the wafer including red and infrared two wavelength semiconductor laser elements 60 are bonded to each other using conductive bonding layer 2 with electrode layers 21 and 22 and p-side pad electrodes 58 and 78 respectively opposed to each other. As shown in FIG. 10, subsequently, n-type GaAs substrate 301 is removed, and then on the upper surfaces of n-type cladding layers 52a and 72a, n-side electrodes 59 and 79 are formed by vacuum deposition, respectively. The lower surface of n-type GaN substrate 11 is polished so that n-type GaN substrate 11 has a predetermined thickness, and then on the lower surface of n-type GaN substrate 11, n-side electrode 19 is formed by vacuum deposition. In such a manner, a wafer including three-wavelength semiconductor laser element units 90 is formed. The wafer is then cleaved in Y direction into a bar shape and is divided at dashed line 800 in X direction into chips, thus forming each three-wavelength semiconductor laser element unit 90 (see FIG. 1) constituting semiconductor laser device 100.

Subsequently, using ceramic collet (not shown), three-wavelength semiconductor laser element unit 90 is pressed against base 91 with conductive bonding layer 1 interposed therebetween and is fixed to base 91.

As shown in FIG. 2, wire bonding region 18a of blue-violet semiconductor laser element 10 and lead terminal 101 are connected with metallic wire 111. Wire bonding region 21a of electrode layer 21 connected to red semiconductor laser element 50 and lead terminal 102 are connected with metallic wire 112, and n-side electrode 59 and base 91 are connected with metallic wire 113. Wire bonding region 22a of electrode layer 22 connected to infrared semiconductor laser element 70 and lead terminal 103 are connected with metallic wire 114, and n-side electrode 79 and base 91 are connected with metallic wire 115. Semiconductor laser device 100 according to the first embodiment (see FIG. 1) is thus formed.

In the first embodiment, as described above, electrode layer 21 is formed so as to extend from between red semiconductor laser element 50 and insulating film 20 (current-blocking layer 16a) toward the waveguide formation region (in Y2 direction) where p-side pad electrode 18 of blue-violet semiconductor laser element 10 is arranged. Accordingly, wire bonding region 21a of electrode layer 21 can be arranged near the waveguide formation region where p-side pad electrode 18 is formed (above ridge 15). This eliminates the need to separately provide an extra area for wire bonding to connect electrode layer 21 to metallic wire 112 at an end of blue-violet laser element 10 in Y1 direction in three-wavelength semiconductor laser element unit 90. Since there is no need to provide an extra area for wire bonding at one end of blue-violet semiconductor laser element 10 in Y direction, it is possible to easily reduce the width of blue-violet semiconductor laser element 10 (in Y direction) constituting three-wavelength semiconductor laser element unit 90.

In the first embodiment, semiconductor laser device 100 includes: red semiconductor laser element 70 bonded to blue-violet laser element 10 with insulating film 20 (current-blocking layer 16b) interposed therebetween; and electrode layer 22 which is provided on the surface of blue-violet semiconductor laser element 10 with insulating film 20 interposed therebetween and is connected to infrared semiconductor laser element 70. Moreover, the optical waveguide (above ridge 15) of blue-violet semiconductor laser element 10 is formed in the waveguide formation region which is not bonded to infrared semiconductor laser element 70, and electrode layer 22 is formed so as to extend from between red semiconductor laser element 70 and insulating film 20 (current-blocking layer 16b) toward the waveguide formation region (in Y1 direction). Accordingly, wire bonding region 22a of electrode layer 22 can be arranged near the waveguide formation region where p-side pad electrode 18 is formed (above ridge 15). This eliminates the need to separately provide an extra area for wire bonding to connect electrode layer 22 to metallic wire 114, as well as to connect electrode layer 21, at an end of blue-violet laser element 10 in Y2 direction in three-wavelength semiconductor laser element unit 90. Since there is no need to provide an extra area for wire bonding at one end of blue-violet semiconductor laser element 10 in Y direction, it is possible to easily reduce the width of blue-violet semiconductor laser element 10 (in Y direction) constituting three-wavelength semiconductor laser element unit 90.

In the first embodiment, insulating film 20 and electrode layers 21 and 22 are formed so as to extend to above optical waveguide (ridge 15) of blue-violet semiconductor laser element 10. Accordingly, wire bonding regions 18a, 21a, and 22a of respective p-side pad electrode 18 and electrode layers 21 and 22 can be arranged together utilizing the waveguide formation region of blue-violet semiconductor laser element 10. Thus it is possible to easily reduce the width of blue-violet semiconductor laser element 10 constituting three-wavelength semiconductor laser element unit 90.

In the first embodiment, red and infrared semiconductor laser elements 50 and 70 are arranged so as to sandwich the waveguide formation region of blue-violet semiconductor laser element 10. Accordingly, electrode layers 21 and 22 can be formed from both sides of p-side pad electrode 18 toward the waveguide formation region where p-side pad electrode 18 is arranged. It is therefore possible to shorten the length of the portions of the electrode layers 21 and 22 extending toward the waveguide formation region.

Furthermore, in the first embodiment, the active layers 13, 53, and 73 are made of a nitride compound semiconductor, an AlGaInP compound semiconductor, and an AlGaAs compound semiconductor, respectively. Accordingly, the first semiconductor laser element of the invention can be formed as blue-violet semiconductor laser element 10 emitting blue-violet laser light, and the second semiconductor laser element of the invention can be formed as red semiconductor laser element 50 emitting laser light having a wavelength different from that of the first semiconductor laser element. Furthermore, the third semiconductor laser element of the invention can be formed as infrared semiconductor laser element 70 emitting laser light having a wavelength different from those of the first and second semiconductor laser elements.

In the first embodiment, because of the manufacturing process thereof, after being formed on the same growth substrate (n-type GaAs substrate 301), red and infrared semiconductor laser elements 50 and 70 can be simultaneously bonded to blue-violet semiconductor laser element 10. The manufacturing process can be therefore simplified.

Modification of First Embodiment

Figure 11:
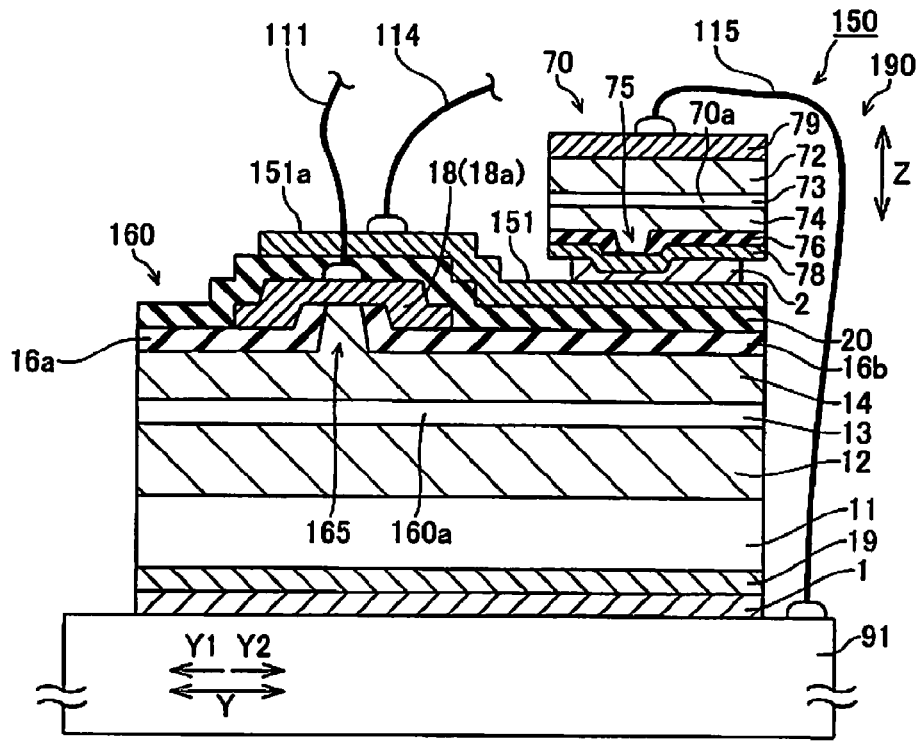
FIG. 11 is a front view showing a structure of a semiconductor laser device according to a modification of the first embodiment.

FIG. 11 is a front view showing a structure of a semiconductor laser device according to a modification of the first embodiment. With reference to FIG. 11, a description is give of semiconductor laser device 150 according to the modification of the first embodiment in which two-wavelength semiconductor laser element unit 190 including blue-violet semiconductor laser elements 160 and infrared semiconductor laser element 70 bonded thereto is fixed to base 91 unlike the first embodiment. Blue-violet and infrared semiconductor laser element 160 and 70 are examples of first and second semiconductor laser elements of the invention, respectively.

Herein, in the semiconductor laser device 150 according to the modification of the first embodiment, as shown in FIG. 11, ridge 165 for forming an optical waveguide is formed at a predetermined distance away from substantially the center of the element in Y1 direction in blue-violet semiconductor laser element 160.

Moreover, insulating film 20 is formed so as to cover the surface of blue-violet semiconductor laser element 160 opposite to n-type GaN substrate 11. Insulating film 20 is also formed so as to cover the surface of blue-violet semiconductor laser element 160 except for wire bonding region 18a, which is a part of p-side pad electrode 18, in the same manner as in the aforementioned first embodiment. Moreover, electrode layer 151 having wire bonding region 151a is formed so as to cover a part of the surface of insulating film 20 corresponding to the region to which infrared semiconductor laser element 70 is bonded. Similarly to the first embodiment, wire bonding regions 18a and 151a are spaced from each other by a predetermined distance in the resonator direction (X direction) so as not to be in contact with each other. Electrode layer 151 is an example of the second electrode of the invention. FIG. 11 is a front view of semiconductor laser device 150 showing the side of light emitting surfaces 160a and 70a.

The other part of the structure and manufacturing process of semiconductor laser device 150 according to the modification of the first embodiment is the same as those of the aforementioned first embodiment.

In the modification of the first embodiment, as described above, electrode layer 151 is formed so as to extend from between infrared semiconductor laser element 70 and insulating film 20 (current-blocking layer 16b) toward the optical waveguide formation region (in Y1 direction) where p-side pad electrode 18 of blue-violet semiconductor laser element 160 is arranged. Accordingly, wire bonding region 151a of electrode layer 151 can be arranged in the vicinity of the waveguide formation region where p-side pad electrode 18 is arranged (above ridge 165). This eliminates the need to separately provide an extra area for wire bonding to connect electrode layer 151 to metallic wire 114 at an end of blue-violet semiconductor laser element 160 in Y2 direction. Since there is no need to provide an extra area for wire bonding at one end of blue-violet semiconductor laser element 160 in Y direction, it is possible to easily reduce the width of blue-violet semiconductor laser element 160 (in Y direction) constituting two-wavelength semiconductor laser element unit 190. The other effects of the modification of the first embodiment are the same as those of the first embodiment.

Second Embodiment

Figure 12:
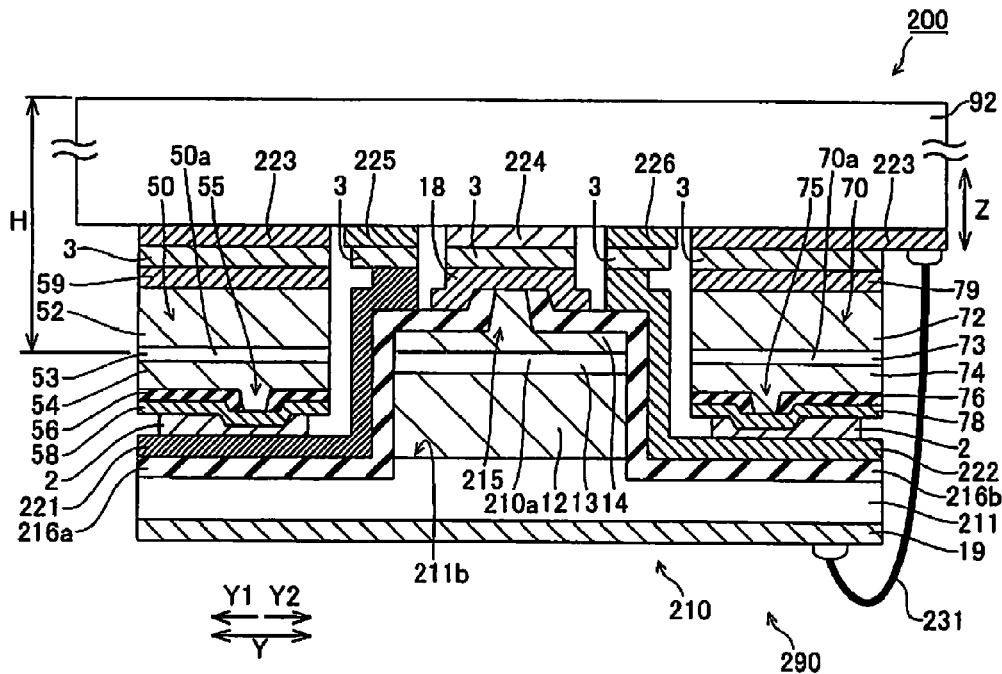
FIG. 12 is a front view showing a structure of a semiconductor laser device according to a second embodiment.
Figure 13:
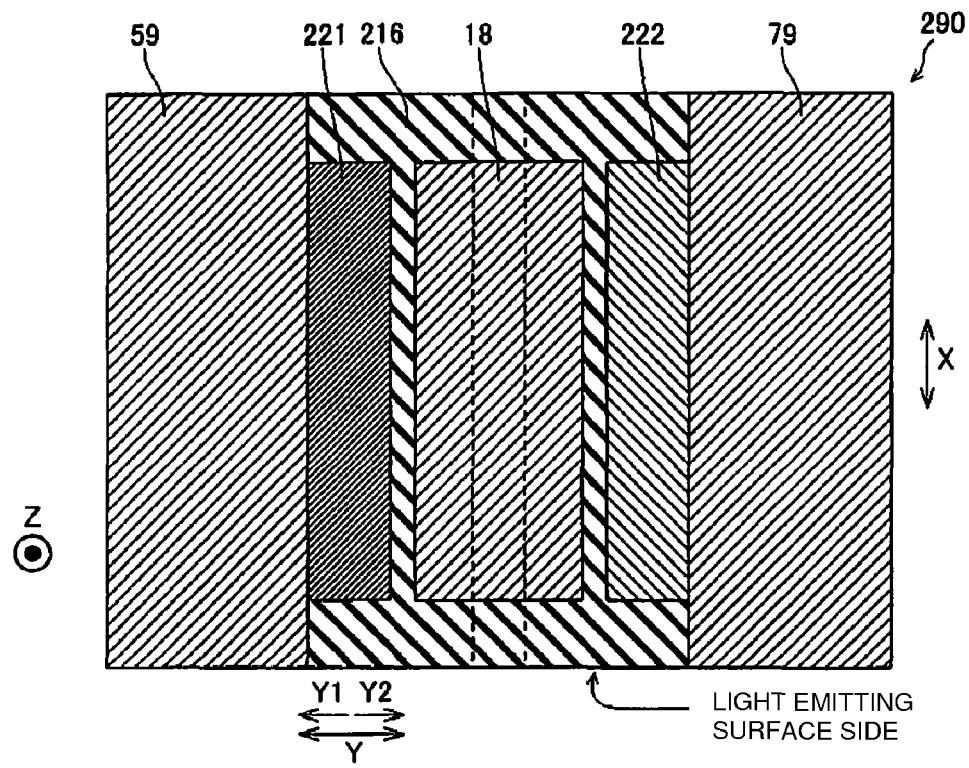
FIG. 13 is a plan view showing the structure of the semiconductor laser device according to the second embodiment shown in FIG. 12.
Figure 14:
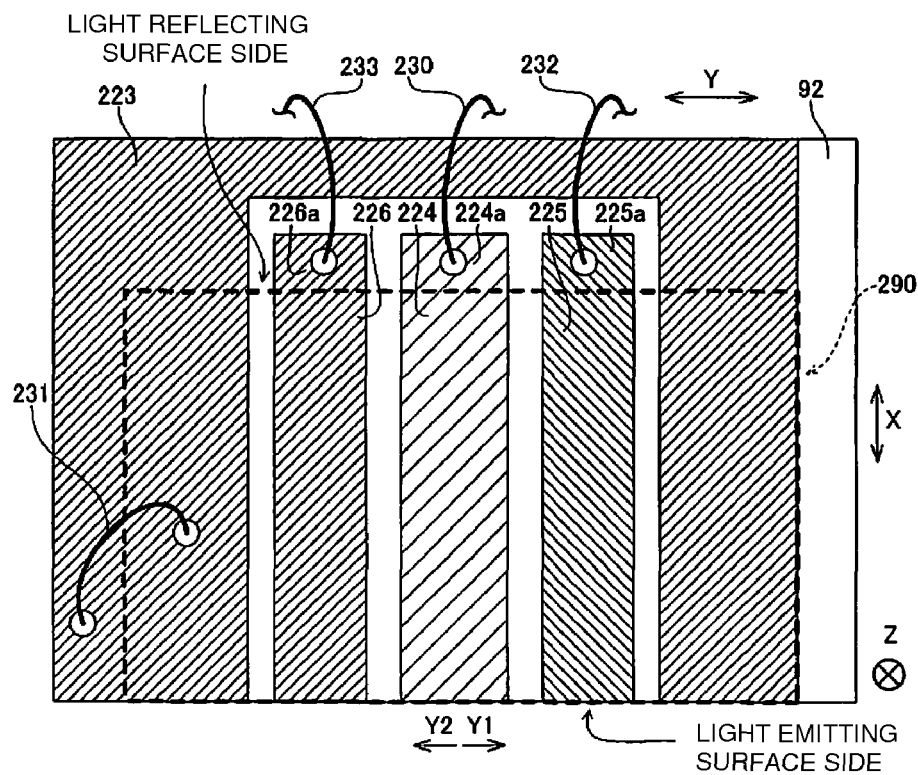
FIG. 14 is a plan view showing the structure of the semiconductor laser device according to the second embodiment shown in FIG. 12.

FIGS. 12 to 14 are front and plan views showing a structure of a semiconductor laser device according to a second embodiment. First, with reference to FIGS. 2 and 12 to 14, a description is given of semiconductor laser device 200 according to the second embodiment in which three-wavelength semiconductor laser element unit 290 including blue-violet semiconductor laser element 210 and red and infrared semiconductor laser elements 50 and 70 which are bonded thereto is fixed to base 92 by junction-down mounting unlike the first embodiment. Blue-violet semiconductor laser element 210 is an example of the first semiconductor laser element of the invention.

In semiconductor laser device 200 according to the second embodiment, as shown in FIG. 12, p-side pad electrode 18 of blue-violet semiconductor laser element 210, n-side electrode 59 of red semiconductor laser element 50, and n-side electrode 79 of infrared semiconductor laser element 70, which constitute three-wavelength semiconductor laser element unit 290, are bonded to the lower surface of insulating base 92 made of AlN or the like with conductive bonding layer 3 interposed therebetween.

As shown in FIG. 12, blue-violet semiconductor laser element 210 has a structure in which n-side semiconductor layer 12, active layer 13, and p-side semiconductor layer 14 are stacked on the upper surface of jut 211b formed in n-type GaN substrate 211. Moreover, current-blocking layers 216a and 216b made of SiO$_2$ are formed so as to cover lower level surfaces of the step of n-type GaN substrate 211 on both sides of the jut 211b, side surfaces of the step of the semiconductor layer including active layer 13, the top surface of the step, and the side surfaces of ridge 215. Current-blocking layers 216a and 216b are examples of the first and second insulating films of the invention, respectively.

In the second embodiment, as shown in FIG. 12, electrode layer 221 is formed on the current-blocking layer 216a to cover a portion to which red semiconductor laser element 50 is bonded, the side surface of the step of the semiconductor layer including the active layer 13 on Y1 direction side, and a part of the top surface of the step. Electrode layer 222 is formed on the current-blocking layer 216b to cover a portion to which red semiconductor laser element 70 is bonded, the side surface of the step of the semiconductor layer including the active layer 13 on Y2 direction side, and a part of the top surface of the step. Electrode layers 221 and 222 are examples of the second and third electrodes of the invention, respectively.

In the second embodiment, as shown in FIG. 12, p-side pad electrode 58 of red semiconductor laser element 50 is bonded to electrode layer 221 on the lower level surface of the step of blue-violet semiconductor laser element 210 with conductive bonding layer 2 interposed therebetween. At the same time, p-side pad electrode 78 of infrared semiconductor laser element 70 is bonded to electrode layer 222 on the lower level surface of the step of blue-violet semiconductor laser element 210 with conductive bonding layer 2 interposed therebetween. Thus, the light emitting region of red semiconductor laser element 50 (in the vicinity of active layer 53) and the light emitting region of infrared semiconductor laser element 70 (in the vicinity of active layer 73) can be arranged at positions substantially equal to the position of the light emitting region of blue-violet semiconductor laser element 210 (in the vicinity of active layer 13) in the height direction of semiconductor laser device 200 (in Z direction). FIG. 12 is a front view of semiconductor laser device 200 showing the side of the light emitting surfaces 210a, 50a, and 70a.

In a plan view of three-wavelength semiconductor laser element unit 290 obtained by removing base 92 from semiconductor laser device 200, as shown in FIG. 13, the electrode layers 221 and 222 are formed so as to be extended in the resonator direction (X direction) and to be arranged at predetermined distances from p-side pad electrode 18 of blue-violet semiconductor laser element 210 in Y direction.

In a plan view of base 92 seen from the junction surface (lower surface) of three-wavelength semiconductor laser element unit 290, as shown in FIG. 14, electrode layer 223 is formed on the lower surface of base 92 so as to correspond to the regions where n-side electrodes 59 and 79 of respective red and infrared semiconductor laser elements 50 and 70 are bonded (see FIG. 12). On base 92, electrode layer 224 is formed so as to correspond to a region to which p-side pad electrode 18 of blue-violet semiconductor laser element 210 is bonded (see FIG. 12). Moreover, on base 92, electrode layer 225 is formed so as to correspond to a region to which electrode layer 221 connected to p-side pad electrode 58 of red semiconductor laser element 50 is bonded (see FIG. 12), and electrode layer 226 is formed so as to correspond to a region to which electrode layer 222 connected to p-side pad electrode 78 of infrared semiconductor laser element 70 is bonded (see FIG. 12). Thus, n-side electrodes 59 and 79 of respective red and infrared semiconductor laser elements 50 and 70 are individually bonded to electrode layer 223 with conductive bonding layers 3 interposed therebetween as shown in FIG. 12. Electrode layers 221 and 222 are bonded to electrode layers 225 and 226 with conductive bonding layers 3 interposed therebetween, respectively, and p-side pad electrode 18 is bonded to electrode layer 224 with conductive layer 3 interposed therebetween.

As shown in FIG. 14, blue-violet semiconductor laser element 210 is connected to lead terminal 101 (see FIG. 2) through metallic wire 230 bonded to wire bonding region 224a of electrode layer 224, and is connected to electrode layer 223 through metallic wire 231 bonded to n-side electrode 19 (see FIG. 12). Red semiconductor laser element 50 is connected to lead terminal 102 (see FIG. 2) through metallic wire 232 bonded to wire bonding region 225a of electrode layer 225, and infrared semiconductor laser element 70 is connected to lead terminal 103 (see FIG. 2) through metallic wire 233 bonded to wire bonding region 226a of electrode layer 226. The other structure of semiconductor laser device 200 according to the second embodiment is the same as that of the aforementioned first embodiment.

Figure 15:
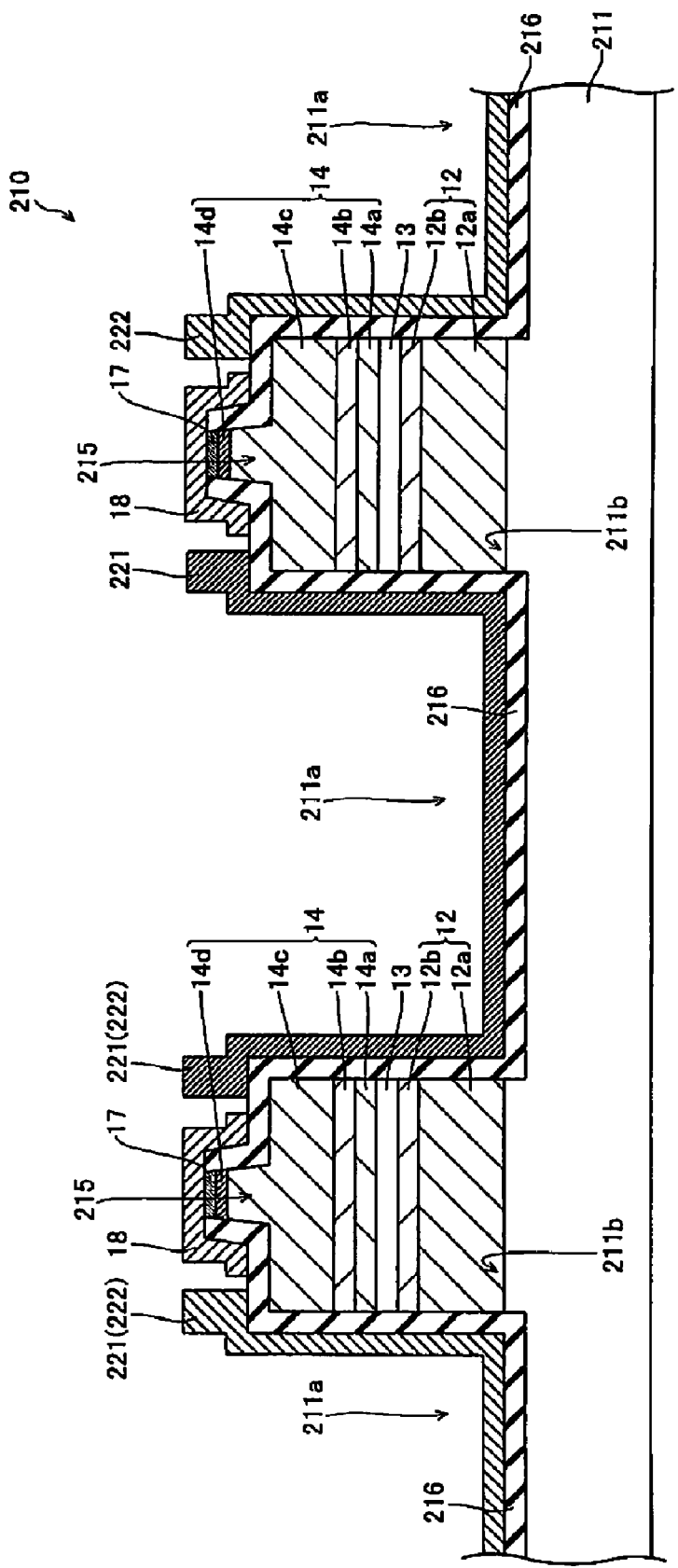
FIG. 15 is a view illustrating a manufacturing process of the semiconductor laser device according to the second embodiment shown in FIG. 12.

FIG. 15 is a view illustrating a manufacturing process of the semiconductor laser device according to the second embodiment shown in FIG. 12. Next, a description is given of the manufacturing process of the semiconductor laser device 200 according to the second embodiment with reference to FIGS. 9, 12, 14, and 15.

First, as shown in FIG. 15, in the manufacturing process of semiconductor laser device 200 according to the second embodiment, the semiconductor layers constituting each blue-violet semiconductor laser element 210 are sequentially formed on the upper surface of n-type GaN substrate 211. Subsequently, recesses 211a whose bottoms reach n-type GaN substrate 211, ridges 215, current-blocking layer 216, p-side ohmic electrodes 17, and p-side pad electrodes 18 are formed, thus producing blue-violet semiconductor laser elements 210 except for n-side electrodes 19. Thereafter, electrode layers 221 and 222 are formed using vacuum deposition so as to cover the predetermined regions of current-blocking layer 216. A wafer including blue-violet semiconductor laser elements 210 except for n-side electrodes 19 is thus produced. The current-blocking layer 216 is an example of the first or second insulating film of the invention.

Subsequently, the wafer including blue-violet semiconductor laser elements 210 and the wafer including red and infrared two-wavelength semiconductor laser elements 60 (see FIG. 9) are bonded to each other using conductive bonding layers 2 so that the electrode layers 221 and 222 are opposed to p-side pad electrodes 58 and 78, respectively. Through the manufacturing process similar to that of the first embodiment, a wafer including three-wavelength semiconductor laser element units 290 is formed. The wafer is cleaved in Y direction into a bar shape and is divided in X direction into chips, thus forming each three-wavelength semiconductor laser element unit 290 constituting semiconductor laser device 200 (see FIG. 12).

As shown in FIG. 14, electrode layer 223 is formed on the lower surface of base 92 so as to correspond to the regions to which n-side electrodes 59 and 79 of respective red and infrared semiconductor laser elements 50 and 70 (see FIG. 12) are bonded. In a similar way, electrode layer 224 is formed so as to correspond to the region to which p-side pad electrode 58 (see FIG. 12) of blue-violet laser element 210 is bonded. Moreover, electrode layer 225 is formed so as to correspond to the region to which electrode layer 221 connected to p-side pad electrode 58 (see FIG. 12) of red semiconductor laser element 50 is bonded, and electrode layer 226 is formed so as to correspond to the region to which electrode layer 222 connected to p-side pad electrode 78 (see FIG. 12) of infrared semiconductor laser element 70 is bonded.

Thereafter, three-wavelength semiconductor laser element unit 290 is fixed to base 92 using conductive bonding layer 3. The other part of the manufacturing process of the second embodiment is the same as that of the first embodiment. Semiconductor laser device 200 according to the second embodiment (see FIG. 12) is thus formed.

In the second embodiment, as described above, active layers 13, 53, and 73 of respective blue-violet, red, and infrared semiconductor laser elements 210, 50, and 70 are arranged in substantially the same plane (at substantially the same distance H from the upper surface of base 92 in the thickness direction of the semiconductor layers (Z direction in FIG. 12)) at predetermined intervals. Accordingly, the light emitting regions of the semiconductor laser elements (210, 50, and 70) can be arranged in substantially the same plane, and light beams emitted from the semiconductor elements (210, 50, and 70) are aligned in substantially the same line. Thus, if semiconductor laser device 200 is applied to optical disk pick-up devices, designing the optical system thereof can be facilitated. The other effects of the second embodiment are the same as those of the aforementioned second embodiment.

Third Embodiment

Figure 16:
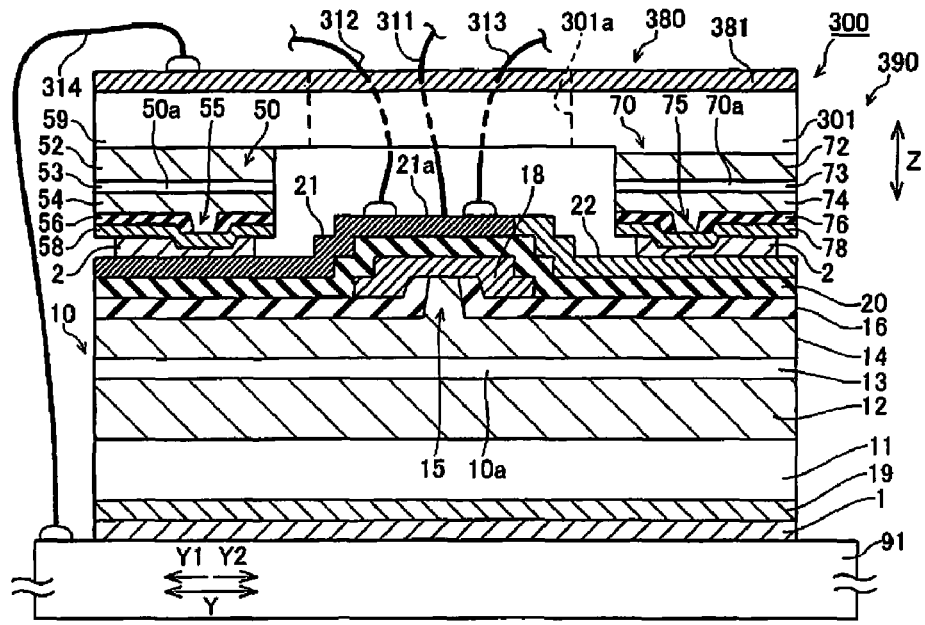
FIG. 16 is a front view showing a structure of a semiconductor laser device according to a third embodiment.
Figure 17:
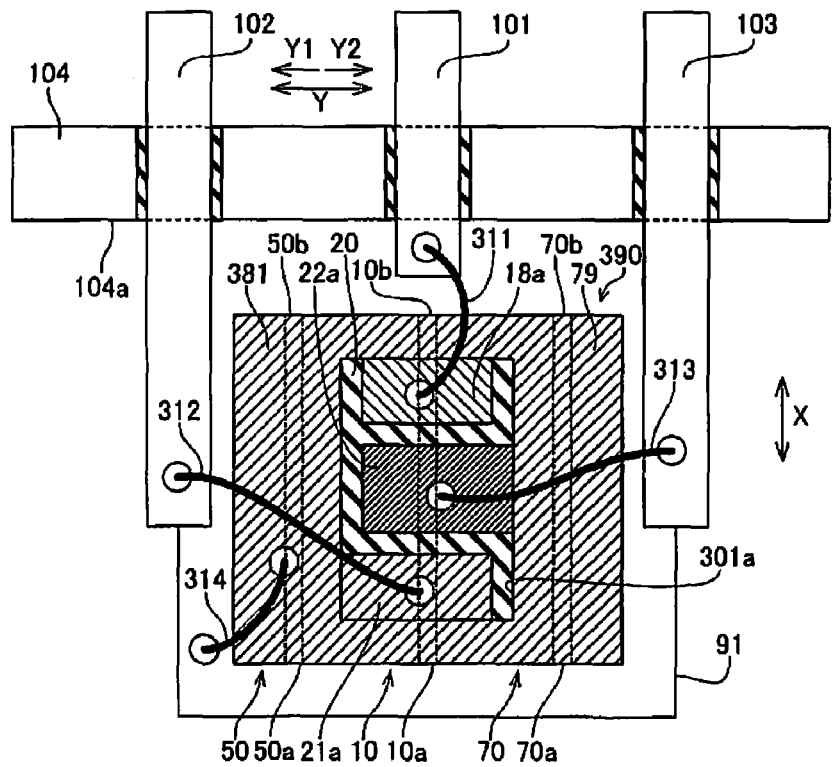
FIG. 17 is a plan view showing the structure of the semiconductor laser device according to the third embodiment shown in FIG. 16.

FIGS. 16 and 17 are front and plan views showing a structure of a semiconductor laser device according to a third embodiment, respectively. With reference to FIGS. 16 and 17, first, a description is given of semiconductor laser device 300 according to the third embodiment in which, unlike the first embodiment, three-wavelength semiconductor laser element unit 390 including: monolithic two-wavelength semiconductor laser element unit 380 having red and infrared semiconductor laser elements 50 and 70; and blue-violet semiconductor laser element 10 bonded thereto is fixed to base 91 with conductive bonding layer 1 interposed therebetween.

As shown in FIG. 16, semiconductor laser device 300 according to the third embodiment includes three-wavelength semiconductor laser element unit 390 having monolithic two-wavelength semiconductor laser element unit 380 and blue violet semiconductor laser element 10 bonded thereto. Monolithic two-wavelength semiconductor laser element unit 380 includes red and infrared semiconductor laser elements 50 and 70 which are formed on the lower surface of n-type GaAs substrate 301 at a predetermined distance in Y direction. N-type GaAs substrate 301 is an example of a "semiconductor" of the invention.

In the third embodiment, as shown in FIG. 17, n-type GaAs substrate 301 of monolithic two-wavelength semiconductor laser element unit 380 is provided with rectangular through-hole 301a. In blue-violet semiconductor laser element 10, metallic wire 311 bonded to wire bonding region 18a is connected to lead terminal 101 through through-hole 301a. In red semiconductor laser element 50, metallic wire 312 bonded to wire bonding region 21a is connected to lead terminal 102 through through-hole 301a. In infrared semiconductor laser element 70, metallic wire 313 bonded to wire bonding region 22a is connected to lead terminal 103 through through-hole 301a. Through-hole 301a has a width of about 70 μm in Y direction.

In the third embodiment, as shown in FIG. 16, n-side electrode 381 is formed on the upper surface of monolithic two-wavelength semiconductor laser terminal unit 380 except for through-hole 301a. Monolithic two-wavelength semiconductor laser element unit 380 is then electrically connected to base 91 through metallic wire 314 bonded to n-side electrode 381. The other structure of semiconductor laser device 300 according to the third embodiment is the same as that of the first embodiment.

Figure 18:
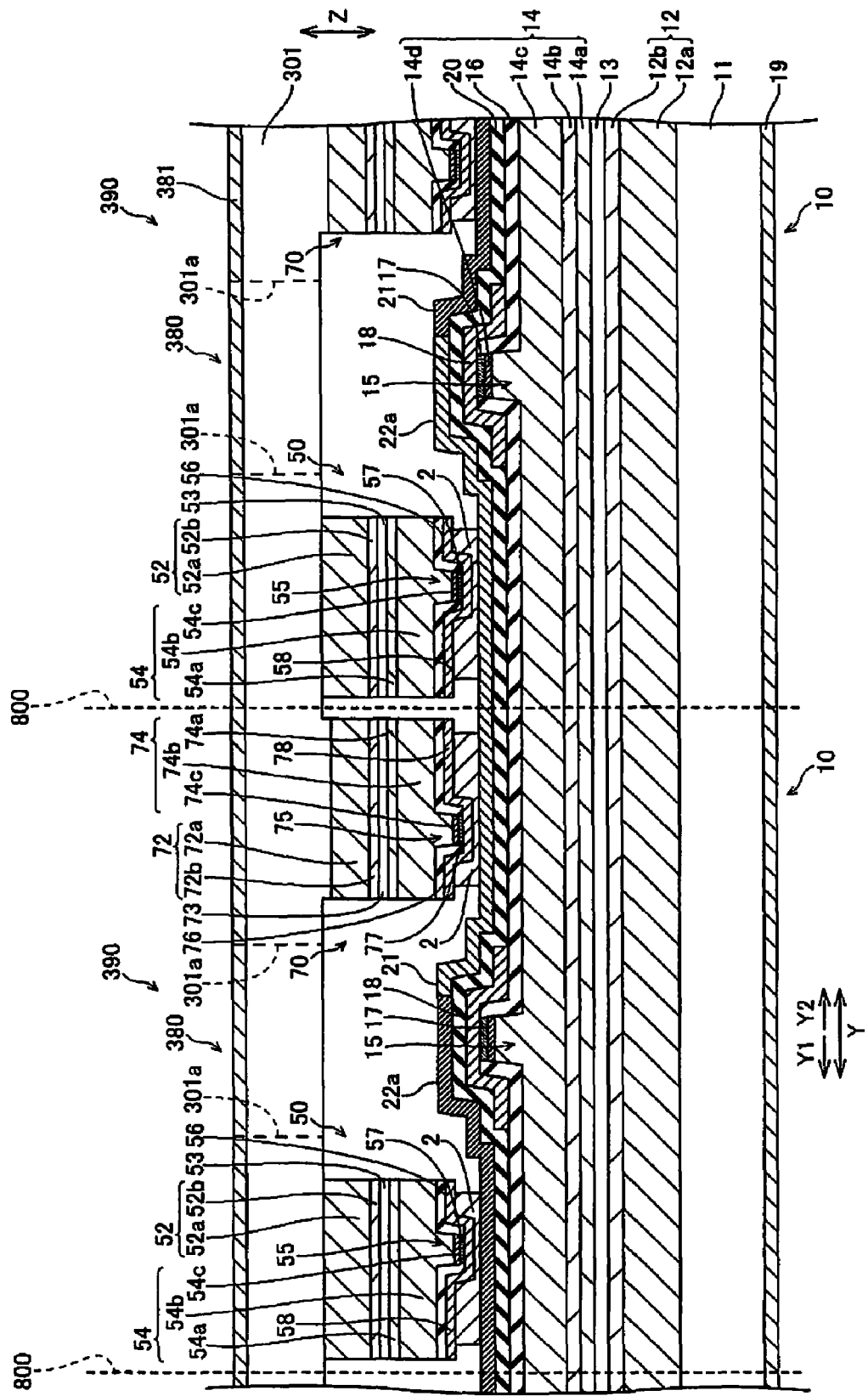
FIG. 18 is a view illustrating a manufacturing process of the semiconductor laser device according to the third embodiment shown in FIG. 16.

FIG. 18 is a view illustrating a manufacturing process of the semiconductor laser device according to the third embodiment shown in FIG. 16. Next, a description is given of the manufacturing process of semiconductor laser device 300 according to the third embodiment with reference to FIGS. 7, 9, 16, and 18.

First, the wafer of FIG. 7 including blue-violet semiconductor laser elements 10 and the wafer of FIG. 9 including red and infrared two-wavelength semiconductor laser elements 60 are bonded to each other using conductive bonding layer 2 with electrode layers 21 and 22 and p-side pad electrodes 58 and 78 opposed to each other, respectively. Thereafter, the upper surface of n-type GaAs substrate 301 is polished so that n-type GaAs substrate 301 has a predetermined thickness. As shown in FIG. 18, each through-hole 301a is formed in a region a little inside (in X and Y directions) of the region where recess 301b of n-type GaAs substrate 301 is formed so as to penetrate n-type GaAs substrate 301 and n-side electrode 381. Thereafter, n-side electrode 381 is formed on the upper surface of n-type Gas substrate 301 using vacuum deposition. After the lower surface of n-type GaN substrate 11 is then polished so that n-type GaN substrate 11 has a predetermined thickness, n-side electrode 19 is formed on the lower surface of n-type GaN substrate 11 using vacuum deposition. A wafer including three-wavelength semiconductor laser element units 390 is thus formed. The wafer is then cleaved in Y direction into a bar shape and divided into chips in X direction at dashed lines 800 along recesses 301c, thus forming each three-wavelength semiconductor laser element unit 390 constituting the semiconductor laser device 300 shown in FIG. 16.

The other part of the manufacturing process of the third embodiment is the same as that of the first embodiment.

Semiconductor laser device 300 according to the third embodiment (see FIG. 16) is thus formed.

In the third embodiment, as described above, red and infrared semiconductor laser elements 50 and 70 are formed on the surface of n-type GaAs substrate 301. Accordingly, n-side electrode 381 on the opposite side to p-side pad electrodes 58 and 78 of respective red and infrared semiconductor laser elements 50 and 70 can be commonly provided on the rear surface of n-type GaAs substrate 301 (the upper surface in FIG. 16). The other effects of the third embodiment are the same as those of the first embodiment.

Fourth Embodiment

Figure 19:
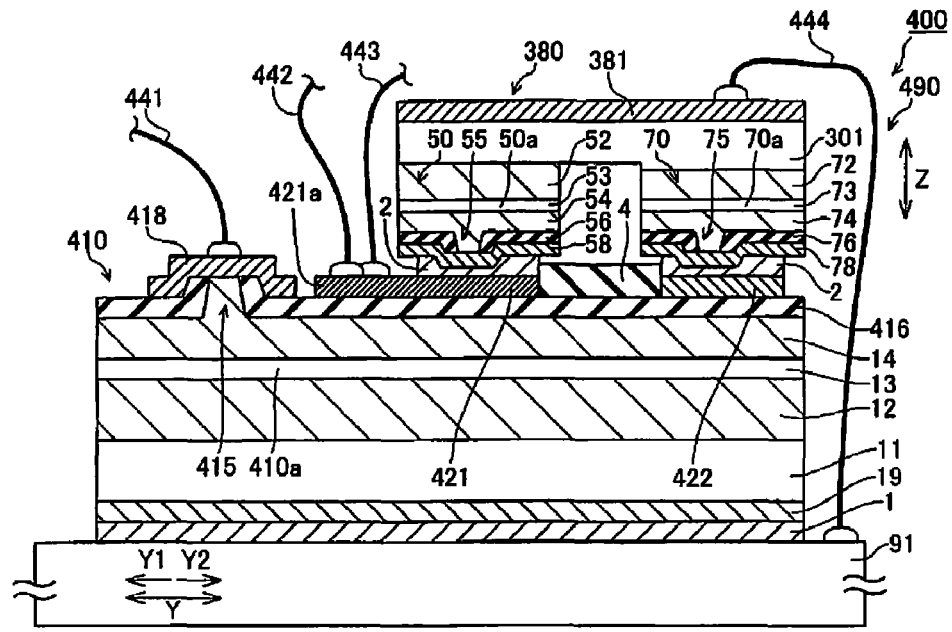
FIG. 19 is a front view showing a structure of a semiconductor laser device according to a fourth embodiment.
Figure 20:
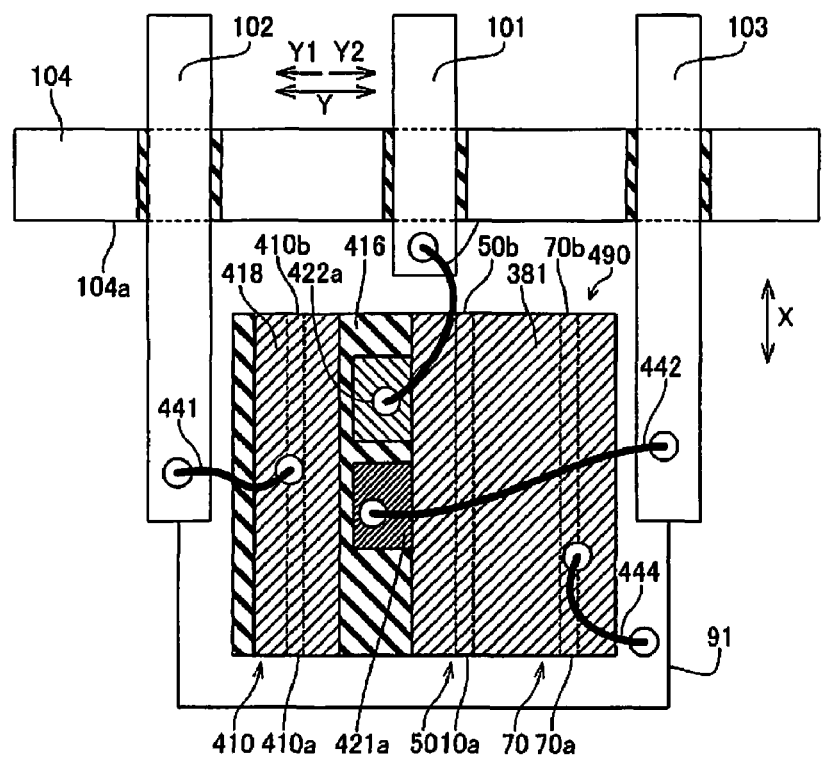
FIG. 20 is a plan view showing the structure of the semiconductor laser device according to the fourth embodiment shown in FIG. 19.
Figure 21:
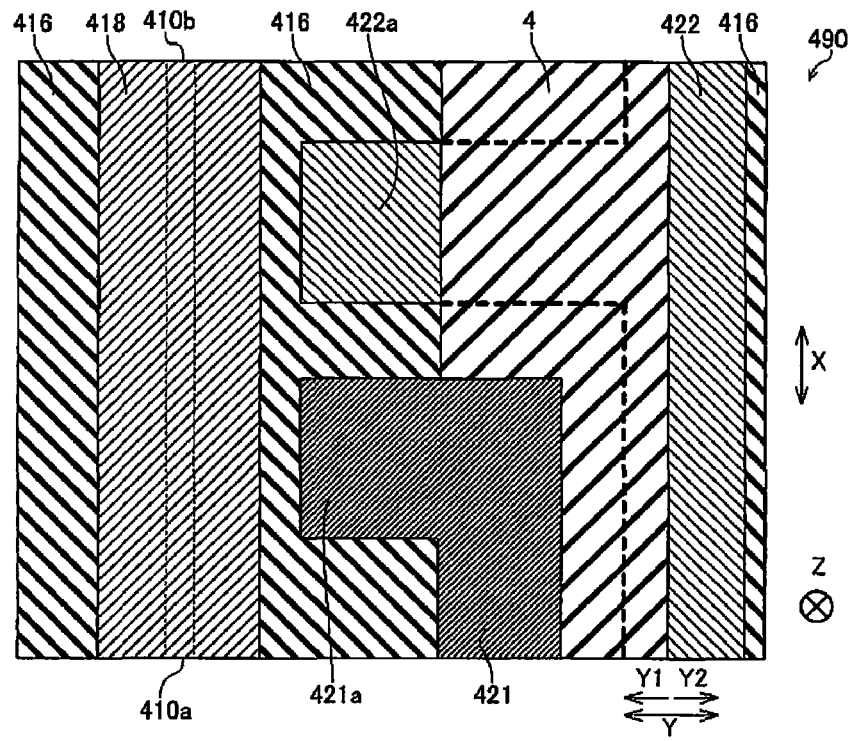
FIG. 21 is a plan view showing the structure of the semiconductor laser device according to the fourth embodiment shown in FIG. 19.

FIGS. 19 to 21 are front and plan views showing a structure of a semiconductor laser device according to a fourth embodiment. With reference to FIGS. 19 to 21, first, a description is given of semiconductor laser device 400 according to the fourth embodiment in which, unlike the third embodiment, three-wavelength semiconductor laser element unit 490 including: blue-violet semiconductor laser element 410 having ridge 415 arranged at an end thereof; and monolithic two-wavelength semiconductor laser element unit 380 which includes red and infrared semiconductor laser elements 50 and 70 and is bonded to the blue-violet semiconductor laser element 410 is fixed to base 91 with conductive bonding layer 1 interposed therebetween. Blue-violet semiconductor laser element 410 is an example of the first semiconductor laser element of the invention, and red and infrared semiconductor laser elements 50 and 70 are examples of the second semiconductor laser element of the invention.

Herein, in the fourth embodiment, as shown in FIG. 19, monolithic two-wavelength laser element unit 380 is bonded to a region of blue-violet semiconductor laser element 410 where the ridge 415 is not formed with the electrode layers 421 and 422 interposed therebetween. The electrode layers 421 and 422 are examples of the second and third electrodes of the invention, respectively. FIG. 19 is a front view of the semiconductor laser device, showing the side of light emitting surfaces 410a, 50a, and 70a.

In a plan view of blue-violet semiconductor laser element 410 which is obtained by removing monolithic two-wavelength semiconductor laser element unit 380 from semiconductor laser device 400, as shown in FIG. 21, electrode layers 421 and 422 are formed so as to cover predetermined regions of current-blocking layer 416 of blue-violet semiconductor laser element 410. Current-blocking layer 416 is an example of the first insulating film of the invention.

Specifically, electrode layer 421 covers a part of current-blocking layer 416 in a region of blue-violet semiconductor laser element 410 where red semiconductor laser element 50 is bonded. A part of electrode layer 421 is formed so as to have wire bonding region 421a protruding and extending in Y1 direction to near the region where ridge 415 of blue-violet semiconductor laser element 410 is formed. Electrode layer 422 covers a part of current-blocking layer 416 in a region of blue-violet semiconductor laser element 410 to which infrared semiconductor laser element 70 is bonded. A part of electrode layer 422 is formed to have wire bonding region 422a protruding and extending in Y1 direction to near the region where ridge 415 of blue-violet semiconductor laser element 410 is formed. The wire bonding regions 421a and 422a are formed at a predetermined distance in the resonator direction (X direction) so as not to be in contact with each other. In order to prevent electrode layer 422 from coming into contact with conductive bonding layer 2 and p-side pad electrode 58 (see FIG. 19) of red semiconductor laser element 50 at bonding red semiconductor laser element 50 (see FIG. 19) to electrode layer 421, as shown in FIG. 21, insulating film 4 made of $SiO_2$ or the like is formed so as to cover a region of the electrode layer 422 to which red semiconductor laser element 50 is bonded.

As shown in FIG. 20, blue-violet semiconductor laser element 410 is connected to lead terminal 102 through metallic wire 441 bonded to p-side pad electrode 418, and n-side electrode 19 (see FIG. 19) thereof is electrically connected to base 91 through the conductive bonding layer 1. Red semiconductor laser element 50 is connected to lead terminal 103 through metallic wire 442 bonded to wire bonding region 421a of electrode layer 421. Infrared semiconductor laser element 70 is connected to lead terminal 101 through metallic wire 443 bonded to wire bonding region 422a of electrode layer 422. Red and infrared semiconductor laser elements 50 and 70 are connected to base 91 through metallic wire 444 bonded to n-side electrode 381. P-side pad electrode 418 is an example of the "first electrode" of the invention.

Next, with reference to FIGS. 9, 19, and 21, a description is given of a manufacturing process of the semiconductor laser device 400 according to the fourth embodiment.

First, a wafer including blue-violet semiconductor laser elements 410 (see FIG. 19) is formed by the manufacturing process as that of the aforementioned first embodiment. At this time, as shown in FIG. 21, p-side pad electrode 418 is formed so as to be exposed entirely in the resonator direction (X direction).

As shown in FIG. 21, electrode layers 421 and 422 are formed by vacuum deposition so as to cover predetermined regions of current-blocking layer 416. At this time, in the fourth embodiment, electrode layer 421 extends in X direction to cover a part of the current-blocking layer 416 corresponding to a region of blue-violet semiconductor laser element 410 to which red semiconductor laser element 50 is bonded. A part of electrode layer 421 is formed to have wire bonding region 421a extending in Y1 direction up to near the region where ridge 415 of blue-violet semiconductor laser element 410 is arranged. Electrode layer 422 extends in X direction to cover a part of the current-blocking layer 416 corresponding to a region of blue-violet semiconductor laser element 410 to which infrared semiconductor laser element 70 is bonded. A part of electrode layer 422 is formed to have wire bonding region 422a extending in Y1 direction up to near the region where ridge 415 of blue-violet semiconductor laser element 410 is arranged. Thereafter, insulating film 4 is formed so as to cover a predetermined region of electrode layer 422.

Subsequently, a wafer including blue-violet semiconductor laser elements 410 (see FIG. 19) and a wafer including red and infrared two-wavelength semiconductor laser element 60 (see FIG. 9) are bonded to each other using conductive bonding layer 2 with electrode layers 21 and 22 being opposed to p-side pad electrodes 58 and 78, respectively. At this time, the wafers are bonded so that recesses 301b are positioned at ridges 415. After the upper surface of n-type GaAs substrate 301 is polished so that n-type GaAs substrate 301 has a predetermined thickness, a part of n-type GaAs substrate 301 corresponding to recesses 301b are removed by etching so that the top of ridge 415 is exposed. Subsequently, n-side electrode 381 is formed on the upper surface of n-type GaAs substrate 301 using vacuum deposition. After the lower surface of n-type GaN substrate 11 is polished so that n-type GaN substrate 11 has a predetermined thickness, n-side electrode 19 is formed on the lower surface of n-type GaN substrate 11 using vacuum deposition. A wafer including three-wavelength semiconductor laser element units 490 is thus formed. The wafer is then cleaved in Y direction into a bar shape and then divided in X direction into chips at each blue-violet semiconductor laser element 410, thus forming each three-wavelength semiconductor laser element unit 490 constituting the semiconductor laser device 400 shown in FIG. 19.

The other part of the manufacturing process of the fourth embodiment is the same as that of the first embodiment. Semiconductor laser device 400 (see FIG. 19) according to the fourth embodiment is thus formed.

In the fourth embodiment, as described above, electrode layers 421 and 422 are formed so as to extend from between current-blocking layer 416 and red semiconductor laser element 50 as well as from between current-blocking layer 416 and infrared semiconductor laser element 70 toward the waveguide formation region where p-side pad electrode 418 of blue-violet semiconductor laser element 410 is arranged (in Y1 direction 1). Accordingly, wire bonding regions 421a and 422a of respective electrode layers 421 and 422 can be provided near the waveguide formation region where p-side pad electrode 418 is arranged. This eliminates the need to separately provide an extra area for wire bonding to connect electrode layers 421 and 422 to respective metallic wires 442, and 443 at an end of blue-violet semiconductor laser element 410 in Y2 direction in three-wavelength semiconductor laser element unit 490. Since there is no need to provide an extra area for wire bonding at one end of blue-violet semiconductor laser element 410 in Y direction, it is possible to easily reduce the width of blue-violet semiconductor laser element 410 (in Y direction) constituting three-wavelength semiconductor laser element unit 490.

Fifth Embodiment

Figure 22:
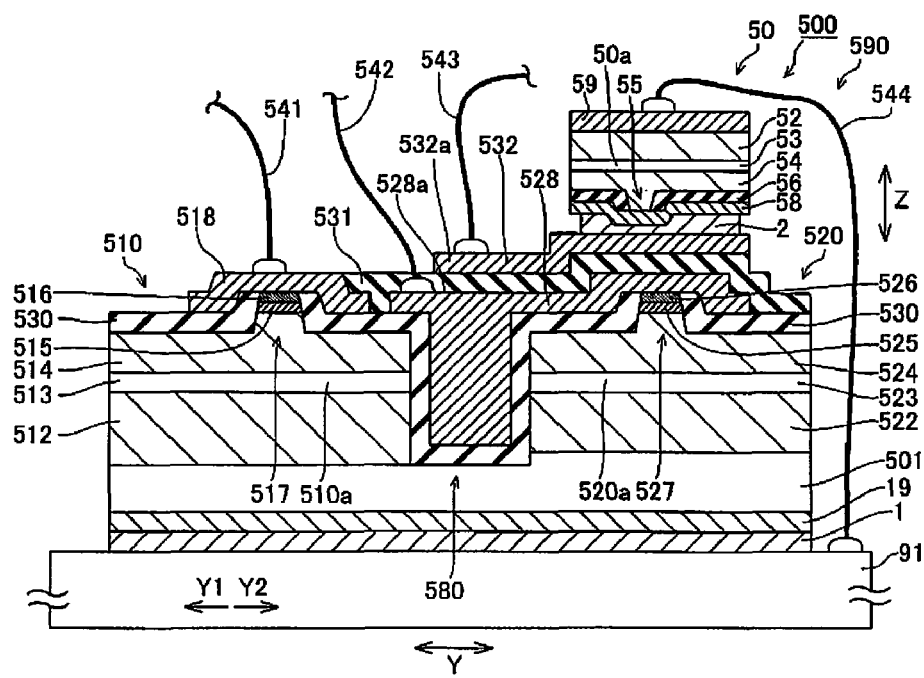
FIG. 22 is a front view showing a structure of a semiconductor laser device according to a fifth embodiment.

FIGS. 22 and 33 are front and plan views showing a structure of a semiconductor laser device according to a fifth embodiment, respectively. In the fifth embodiment, with reference to FIGS. 22 and 23, a description is given of a case, unlike the first to fourth embodiments, where RGB three-wavelength semiconductor laser element unit 590 including: monolithic two-wavelength semiconductor laser element unit 580 having green and blue semiconductor laser elements 510 and 520; and red semiconductor laser element 50 bonded thereto is fixed to base 91 with conductive bonding layer 1 interposed therebetween. Green and red semiconductor laser elements 510 and 50 are examples of the first and second semiconductor laser elements of the invention, respectively.

As shown in FIG. 22, semiconductor laser device 500 according to the fifth embodiment includes RGB three-wavelength semiconductor laser element unit 590 having monolithic two-wavelength semiconductor laser element unit 580 and red semiconductor laser element 50 bonded thereto. The monolithic two-wavelength semiconductor laser element unit 580 includes green and blue semiconductor laser elements 510 and 520 formed on the upper surface of n-type GaN substrate 501 at a predetermined distance in Y direction.

As shown in FIG. 22, green semiconductor laser element 510 includes: n-type cladding layer 512 made of n-type InGaN; active layer 513 having an MQW structure; p-type cladding layer 514 made of p-type InGaN; p-side contact layer 515; and p-side ohmic electrode 516, which are stacked on the upper surface of n-type GaN substrate 501. Blue semiconductor laser element 520 includes: n-type cladding layer 522; active layer 523 having an MQW structure; p-type cladding layer 524 made of p-type InGaN; p-side contact layer 525; and p-side ohmic electrode 526, which are stacked on the upper surface of n-type GaN substrate 501. Active layer 513 is an example o the first active layer of the invention.

Current-blocking layers 530 made of $SiO_2$ are formed so as to cover upper surfaces of flat sections of p-type cladding layer 514 and side surfaces of ridge section 517 in green semiconductor laser element 510, and to cover upper surfaces of flat sections of p-type cladding layer 524 and side surfaces of ridge section 527 in blue semiconductor laser element 520. Moreover, p-side pad electrode 518 is formed so as to cover upper surfaces of p-side ohmic electrode 516 and current-blocking layer 530. In addition, p-side pad electrode 528 covers upper surfaces of p-side ohmic electrode 526 and current-blocking layer 530 so as to extend in X direction, and includes wire bonding region 528a protruding and extending in Y1 direction to substantially the middle position in Y direction between blue and green semiconductor laser elements 510 and 520. P-side pad electrode 518 is an example of the first electrode of the invention.

Figure 23:
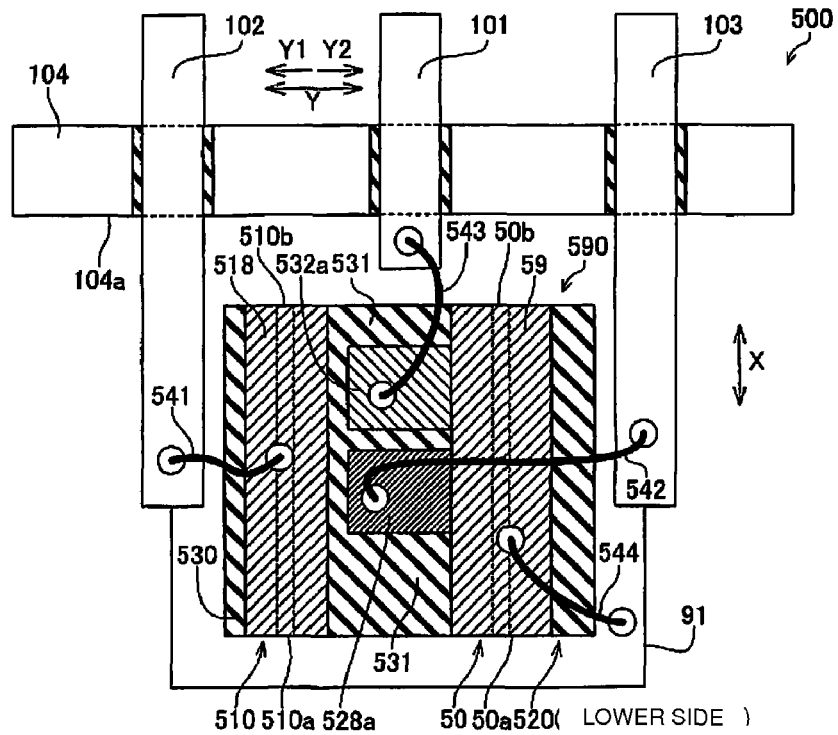
FIG. 23 is a plan view showing the structure of the semiconductor laser device according to the fifth embodiment shown in FIG. 22.

In the fifth embodiment, as shown in FIG. 22, insulating film 531 is formed so as to cover p-side pad electrode 528 of monolithic two-wavelength semiconductor laser element unit 580. As shown in FIG. 23, insulating film 531 is formed on the surface of blue semiconductor laser element 520 so as to cover the region of p-side pad electrode 528 except for wire bonding region 528a. Accordingly, only wire bonding region 528a is exposed. Insulating film 531 is an example of the first insulating film of the invention.

As shown in FIGS. 22 and 23, electrode layer 532 is formed so as to cover a predetermined region of insulating film 531. Specifically, electrode layer 532 covers a part of insulating film 531 corresponding to a region of blue semiconductor laser element 520 to which red semiconductor laser element 50 is bonded, and includes wire bonding region 532a protruding and extending in Y1 direction to substantially the middle position in Y direction between green and blue semiconductor laser elements 510 and 520. Wire bonding regions 528a and 532a are formed at a predetermined distance in the resonator direction (X direction) so as not to be in contact with each other. Electrode layer 532 is an example of the second electrode of the invention.

In the fifth embodiment, p-side pad electrode 58 of red semiconductor layer element 50 is bonded to electrode layer 532 above blue semiconductor laser element 520 with conductive bonding layer 2 interposed therebetween.

As shown in FIG. 23, green semiconductor laser element 510 is connected to lead terminal 102 through metallic wire 541 bonded to p-side pad electrode 518. Blue semiconductor laser element 520 is connected to lead terminal 103 through metallic wire 542 bonded to wire bonding region 528a of p-side pad electrode 528. In green and blue semiconductor laser elements 510 and 520, n-side electrode 19 (see FIG. 22) is electrically connected to base 91 through conductive bonding layer 1. Red semiconductor laser element 50 is connected to lead terminal 101 through metallic wire 543 bonded to wire bonding region 532a of p-side pad electrode 532, and is connected to base 91 through metallic wire 544 bonded to n-side electrode 59. FIG. 22 is a front view showing the side of light emitting surfaces 510a, 520a, and 50a. The other part of the structure and manufacturing process of the semiconductor laser device 500 of the fifth embodiment is the same as those of the aforementioned embodiments.

In the fifth embodiment, as described above, electrode layer 532 is formed so as to extend from between red semiconductor laser element 50 and insulating film 531 toward the waveguide formation region where the p-side pad electrode 518 of green semiconductor laser element 510 is arranged (in Y1 direction). Accordingly, the wire bonding region 532a of electrode layer 532 can be arranged near the waveguide formation region where p-side electrode 518 is provided. This eliminates the need to separately provide an extra area for wire bonding to connect electrode layer 532 to metallic wire 543 at an end of monolithic two-wavelength semiconductor laser element unit 580 in Y2 direction in RGB three-wavelength semiconductor laser element unit 590. Since there is no need to provide an extra area for wire bonding at one end of monolithic two-wavelength semiconductor laser element unit 580 in Y direction, it is possible to easily reduce the width of monolithic two-wavelength semiconductor laser element unit 580 (in Y direction) constituting RGB three-wavelength semiconductor laser element unit 590. The other effects of the fifth embodiment are the same as those of the aforementioned second embodiment.

Sixth Embodiment

Figure 24:
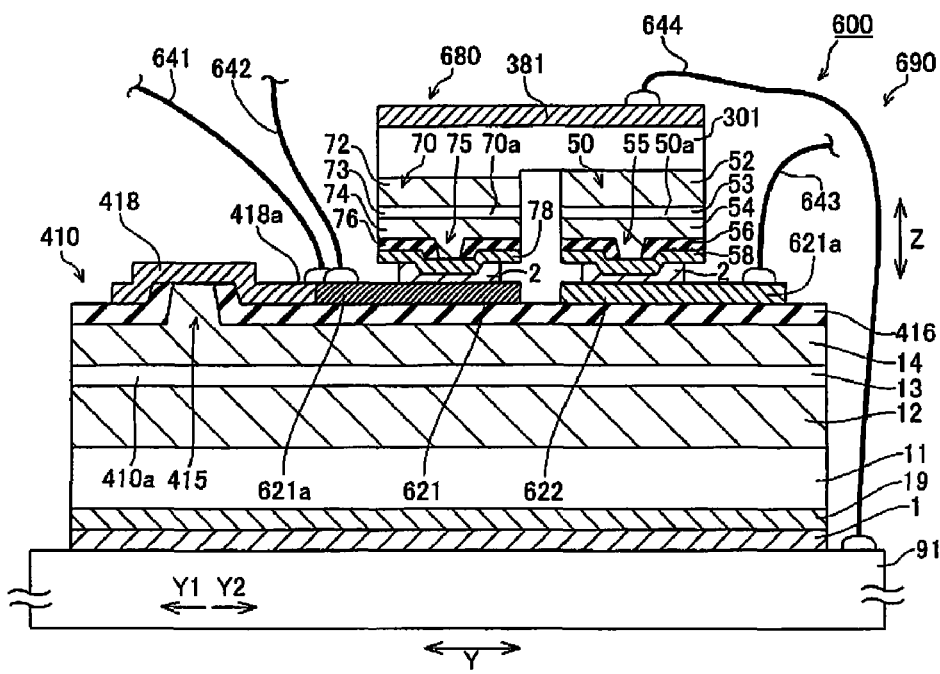
FIG. 24 is a front view showing a structure of a semiconductor laser device according to a sixth embodiment.
Figure 25:
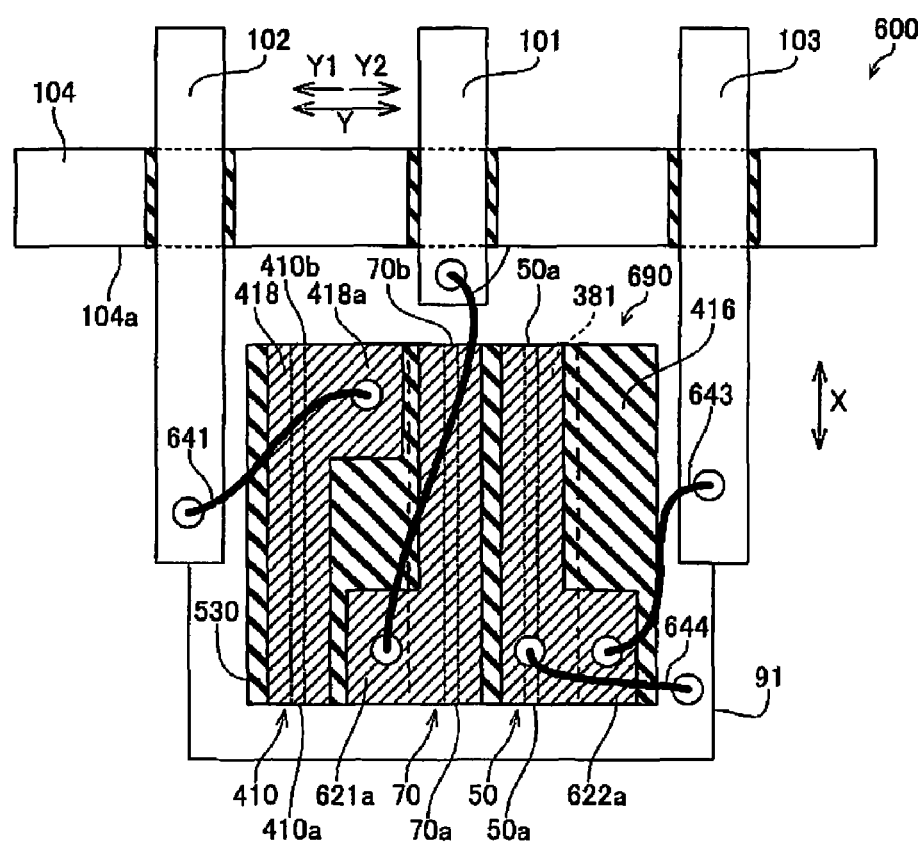
FIG. 25 is a plan view showing the structure of the semiconductor laser device according to the sixth embodiment shown in FIG. 24.

FIGS. 24 and 25 are front and plan views showing a structure of a semiconductor laser device according to a sixth embodiment, respectively. In the sixth embodiment, with reference to FIGS. 24 and 25, a description is given of a case where, unlike the fourth embodiment, wire bonding regions of electrode layers bonded to red and infrared semiconductor laser elements 50 and 70 constituting monolithic two-wavelength semiconductor laser element unit 680 are formed so as to extend opposite to each other in Y direction. Infrared semiconductor laser element 70 is an example of the second semiconductor laser element of the invention.

As shown in FIG. 24, semiconductor laser device 600 according to the sixth embodiment includes three-wavelength semiconductor laser element unit 690 in which monolithic two-wavelength semiconductor laser element unit 680 including red and infrared laser elements 50 and 70 is bonded to blue-violet semiconductor laser element 410 having ridge 415 positioned on a side (on Y1 direction) of the element in the width direction.

In the sixth embodiment, as shown in FIG. 25, monolithic two-wavelength semiconductor laser element unit 380 is bonded on a region of blue-violet semiconductor laser element 410 where ridge 415 is not formed with electrode layers 621 and 622 interposed therebetween. Electrode layer 621 is an example of the second electrode of the invention.

In a plan view of semiconductor laser device 600, as shown in FIG. 25, electrode layers 621 and 622 are formed so as to cover predetermined regions of current-blocking layer 416 of blue-violet semiconductor laser elements 410.

Specifically, electrode layer 621 covers a part of current-blocking layer 416 corresponding to a region of blue-violet semiconductor laser element 410 where infrared semiconductor laser element 70 is bonded, and includes wire bonding region 621a protruding and extending in Y1 direction to near the region where ridge 415 of blue-violet semiconductor laser element 410 is formed. Electrode layer 622 covers a part of current-blocking layer 416 corresponding to a region of blue-violet semiconductor laser element 410 to which red semiconductor laser element 50 is bonded, and includes wire bonding region 622a protruding and extending in Y2 direction.

As shown in FIG. 25, blue-violet semiconductor laser element 410 is connected to lead terminal 102 through metallic wire 641 bonded to wire bonding region 418a of p-side pad electrode 418 protruding and extending in Y2 direction, and n-side electrode 19 (see FIG. 24) thereof is electrically connected to base 91 through conductive bonding layer 1. Infrared semiconductor laser element 70 is connected to lead terminal 101 through metallic wire 642 bonded to wire bonding region 621a of electrode layer 621. Red semiconductor laser element 50 is connected to lead terminal 103 through metallic wire 643 bonded to wire bonding region 622a of electrode layer 622. Red and infrared semiconductor laser elements 50 and 70 are connected to base 91 through metallic wire 644 bonded to n-side electrode 381. FIG. 24 is a front view showing the side of light emitting surfaces 410a, 50a, and 70a. The other part of the structure and manufacturing process of semiconductor laser device 600 according to sixth embodiment are the same as that of the fourth embodiment.

In sixth embodiment, as described above, electrode layer 621 is formed so as to extend from between infrared semiconductor laser element 70 and current-blocking layer 416 toward the waveguide formation region where the p-side pad electrode 418 of blue-violet semiconductor laser element 410 is formed (in Y1 direction). Accordingly, wire bonding region 621a of electrode layer 621 can be arranged near the waveguide formation region where p-side electrode 418 is arranged. This eliminates the need to separately provide an extra area for wire bonding to connect electrode layer 621 to metallic wire 642 at an end of blue-violet semiconductor laser element unit 410 in Y1 direction in three-wavelength semiconductor laser element unit 690. Since there is no need to provide an extra area for wire bonding at one end of blue-violet semiconductor laser element 410 in Y direction, it is possible to easily reduce the width of blue-violet semiconductor laser element 410 (in Y direction) constituting three-wavelength semiconductor laser element unit 690. Moreover, wire bonding region 622a of electrode layer 622 where red semiconductor laser element 50 is bonded is formed so as to extend toward lead terminal 103 (in Y2 direction). Accordingly, metallic wire 643 can be shortened. The other effects of the sixth embodiment are the same as those of the aforementioned fourth embodiment.

The embodiments disclosed in this specification should be considered as illustrative in every respect and not restrictive. The scope of the invention is defined not by the above-described embodiments but by the scope of the claims, and includes all changes within the meaning and scope equivalent to the scope of the claims.

For example, in the examples of the aforementioned first and third embodiments, the insulating film is separately formed on the current-blocking layer constituting the first semiconductor laser element, and a part of the insulating film is extended to above the p-side pad electrode (the waveguide formation region) of the first semiconductor laser element to cover the predetermined region of the p-side pad electrode, thus achieving insulation between the electrode layers connected to the p-side electrodes of the second and third semiconductor laser elements and the p-side pad electrode of the first semiconductor laser element. However, the invention is not limited to this, and the electrode layers connected to the p-side electrodes of the second and third semiconductor laser elements may be directly formed on the current-blocking layer constituting the first semiconductor laser element, and insulating films for insulating the electrode layers connected to the p-side electrodes of the second and third semiconductor laser elements from the p-side pad electrode of the first semiconductor laser element may be formed only a near-p-side pad electrode region including a region above the p-side pad electrode of the first semiconductor laser element (waveguide formation region).

The third embodiment illustrates the example in which n-type GaAs substrate 301 of monolithic two-wavelength semiconductor laser element unit 380 is provided with the rectangular through-hole. The invention is not limited to this, and the n-type GaAs substrate 301 may be provided with other than the rectangular through hole, for example, such as a circular through-hole.

The above first to sixth embodiments illustrate the examples in which the base to which the multi-wavelength semiconductor laser element unit is bonded includes a substrate made of AlN. The invention is not limited to this, and the base may include a substrate made of an insulator having a good thermal conductivity, such as SiC, Si, diamond, or cubic boron nitride (CBN).

Moreover, the above first to fourth and sixth embodiment illustrate the examples in which the blue-violet semiconductor laser element is made of a nitride semiconductor layer of AlGaN, InGaN, or the like. The invention is not limited to this, the blue-violet semiconductor laser element may be made of a nitride semiconductor layer of a wurtzite structure which is made AlN, InN, BN, TlN, and mixed crystal thereof.

The above first to sixth embodiments illustrate the examples of the ridge waveguide semiconductor laser in which the upper cladding layer including the ridge is formed on the flat active layer and the dielectric block layer is formed on the side surfaces of the ridge. However, the invention is not limited to this, and a ridge waveguide semiconductor laser including a block layer made of a semiconductor, a buried heterostructure (BH) semiconductor laser, a gain guided semiconductor laser in which a current-blocking layer having a stripe opening is formed on the flat upper cladding layer may be formed.

As described above, according to the semiconductor laser devices of the embodiments and manufacturing methods thereof, the width of the elements of the integrated semiconductor laser device can be easily made small.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A semiconductor laser device comprising:
    a first substrate;
    a first semiconductor laser element that is formed on a surface of the first substrate and includes a first active layer;
    a first insulating film formed on a surface of the first semiconductor laser element on a side including the first active layer;
    a second semiconductor laser element bonded to the first semiconductor laser element with the first insulating film interposed therebetween;
    a first electrode connected to the first semiconductor laser element; and
    a second electrode that is arranged on the surface of the first semiconductor laser element with the first insulating film interposed therebetween and is connected to the second semiconductor laser element, wherein
    the first semiconductor laser element has an optical waveguide formed in a region where the second semiconductor laser element is not bonded while the first electrode is arranged on the region, and
    the second electrode is formed to extend from between the second semiconductor laser element and first insulating film toward the region.

2. The semiconductor laser device of claim 1, further comprising:
    a third semiconductor laser element bonded to the first semiconductor laser element with a second insulating film interposed therebetween; and
    a third electrode which is arranged on the surface of the first semiconductor laser element with the second insulating film interposed therebetween and is connected to the third semiconductor laser element, wherein
    the third semiconductor laser element is not bonded to the region, and
    the third electrode is formed to extend from between the third semiconductor laser element and second insulating film toward the region.

3. The semiconductor laser device of claim 2, wherein the first and second insulating films and the second and third electrodes are formed to extend over the optical waveguide of the first semiconductor laser element.

4. The semiconductor laser device of claim 2, wherein the second and third semiconductor laser elements are arranged to sandwich the region.

5. The semiconductor laser device of claim 2, wherein the second and third semiconductor laser elements include second and third active layers, respectively, and the second and third semiconductor laser elements are formed on a surface of a same semiconductor.

6. The semiconductor laser device of claim 1, further comprising
    a second substrate, wherein
    the second and third semiconductor laser elements are formed on a surface of the second substrate.

7. The semiconductor laser device of claim 5, wherein the second substrate comprises a through-hole provided above the region, and the first electrode is electrically connected to a wire, the wire being electrically connected to an external terminal through the through-hole.

8. The semiconductor laser device of claim 5, wherein the same semiconductor is a second substrate.

9. The semiconductor laser device of claim 2, wherein the second and third semiconductor laser elements are arranged on one side of the first semiconductor laser device to the region.

10. The semiconductor laser device of claim 1, further comprising a fourth semiconductor laser element, wherein the first and fourth semiconductor laser elements are formed on a surface of the first substrate.

11. The semiconductor laser device of claim 10, further comprising a fourth electrode that is arranged on a surface of the second semiconductor laser element with the first insulating film interposed therebetween and is connected to the fourth semiconductor laser element, wherein the fourth electrode is formed to extend from between the fourth semiconductor laser device and the first insulating film toward the region.

12. The semiconductor laser device of claim 1, wherein the first semiconductor laser element includes the first active layer at a jut formed on the side of the first active layer.

13. The semiconductor laser device of claim 12, wherein the second semiconductor laser element is arranged at a lower surface sideward of the jut.

14. The semiconductor laser device of claim 13, wherein the second electrode is arranged at the lower surface, a side surface of the jut and a top surface of the jut.

15. The semiconductor laser device of claim 1, wherein the first and second electrodes and an electrode opposite polarity to the second electrode of the second semiconductor laser element are bonded to a base.

16. The semiconductor laser device of claim 15, wherein the first and second electrodes and an electrode opposite polarity to the second electrode of the second semiconductor laser element are bonded to a base with a conducting bonding layer.

17. The semiconductor laser device of claim 15, wherein an electrode opposite polarity to the first electrode of the first semiconductor laser element is electrically coupled to the base with a second wire.

18. The semiconductor laser device of claim 15, wherein the second electrode is formed to extend over the optical waveguide.

19. The semiconductor laser device of claim 1, wherein the first active layer is made of nitride semiconductor.

20. A method of manufacturing a semiconductor laser device, comprising:
   forming a first semiconductor laser element on a surface of a first substrate, the first semiconductor laser element including a first active layer and an optical waveguide;
   forming an insulating film on a surface of the first semiconductor laser element on a side including the first active layer;
   forming a first electrode above a region where the optical waveguide is formed, the first electrode being connected to the first semiconductor laser element;
   forming a second semiconductor laser element;
   forming a second electrode at a position on the surface of the first semiconductor laser element with the insulating film interposed therebetween, the position extending from between the second semiconductor laser element and the insulating film toward the region, the second electrode connected to the second semiconductor laser element; and
   bonding the second electrode to the second semiconductor laser element.

* * * * *